United States Patent [19]

Link et al.

[11] Patent Number: 5,276,354
[45] Date of Patent: * Jan. 4, 1994

[54] INTEGRATED CIRCUIT PACKAGE WITH BATTERY HOUSING

[75] Inventors: Joseph Link, Carrollton; Michael L. Bolan, Dallas; Allen H. Brunk, Jr., Carrollton; Paul E. Schneikart, Lewisville, all of Tex.

[73] Assignee: SGS-Thomson Microelectronics, Inc., Carrollton, Tex.

[*] Notice: The portion of the term of this patent subsequent to Oct. 8, 2008 has been disclaimed.

[21] Appl. No.: 675,074

[22] Filed: Mar. 25, 1991

Related U.S. Application Data

[63] Continuation of Ser. No. 389,538, Aug. 4, 1989, which is a continuation of Ser. No. 846,510, Mar. 28, 1986, Pat. No. 4,998,888, which is a continuation of Ser. No. 633,374, Jul. 23, 1984, abandoned, which is a continuation of Ser. No. 282,183, May 27, 1981, abandoned.

[51] Int. Cl.⁵ ............... H02J 9/00; H01L 23/48
[52] U.S. Cl. ..................... 307/66; 307/150; 257/666; 257/678; 257/724
[58] Field of Search ............ 307/19, 20, 43–48, 64–66, 150; 365/229, 226; 357/70, 74, 75, 79; 174/52.2, 52.4

[56] References Cited

U.S. PATENT DOCUMENTS

| | | | |
|---|---|---|---|
| 2,782,389 | 2/1957 | Sunko et al. | 339/192 |
| 3,289,045 | 11/1966 | Pritikin et al. | 317/101 |
| 3,575,678 | 4/1971 | Barton | 335/151 |
| 3,634,600 | 1/1972 | Griffin et al. | 174/525 |
| 3,816,768 | 6/1974 | Stein | 307/296 |
| 3,823,388 | 7/1974 | Chadima, Jr. et al. | 340/172.5 |
| 3,859,638 | 1/1975 | Hume, Jr. | 340/173 R |
| 4,019,174 | 4/1977 | Vanderpool et al. | 340/172.5 |
| 4,051,945 | 10/1977 | Fujimoto et al. | 197/176 |
| 4,107,400 | 8/1978 | Grohoski | 429/98 |
| 4,122,359 | 10/1978 | Breikss | 307/64 |
| 4,142,287 | 3/1979 | Grabbe | 29/628 |

(List continued on next page.)

FOREIGN PATENT DOCUMENTS

| | | |
|---|---|---|
| 2752385 | 8/1978 | Fed. Rep. of Germany . |
| 5266281 | 2/1972 | Japan . |
| 1313718 | 4/1973 | United Kingdom . |
| 1507036 | 4/1978 | United Kingdom . |
| 1520573 | 8/1978 | United Kingdom . |
| 1549191 | 7/1979 | United Kingdom . |
| 1549307 | 7/1979 | United Kingdom . |
| 1554013 | 10/1979 | United Kingdom . |

OTHER PUBLICATIONS

IBM Technical Disclosure Bulletin, vol. 15, No. 11, Apr. 1973, pp. 3408–3409.
IBM Technical Disclosure Bulletin, vol. 15, No. 9, Feb. 1973 p. 2830.
IBM Technical Disclosure Bulletin, vol. 14, No. 9, Feb. 1972, pp. 2712–2713.
Effluent Monitoring for Nuclear Safeguards, by Luciano Stanchi, 1976 Nuclear Science Symposium.

*Primary Examiner*—A. D. Pellinen
*Assistant Examiner*—Aditya KG232r2ishnan
*Attorney, Agent, or Firm*—Michael R. Cannatti; Lisa K. Jorgenson; Richard K. Robinson

[57] ABSTRACT

An integrated circuit, typically a random access memory, is housed in a package (14). In the application associated with the integrated circuit it is desired to maintain the data states stored in the memory even when the normal supply voltage is disconnected from the package (14). Batteries (24, 26) are secured in recesses (20, 22) within a structure (12) which is connected to the integrated circuit package (14). A top spring clip (100) is provided to securely hold the batteries (24, 26) within the recesses (20, 22) and forms a common conductor in contact with the upper terminal of both batteries. A bottom spring clip (74, 76) is provided for each of the recesses (20, 22) to form separate conductors in contact with the lower terminal of each battery. The batteries can be readily inserted and removed over lips (64, 70) in the recess (20, 22).

13 Claims, 3 Drawing Sheets

U.S. PATENT DOCUMENTS

| | | | |
|---|---|---|---|
| 4,143,283 | 3/1979 | Graf et al. | 307/66 |
| 4,143,417 | 3/1979 | Wald et al. | 364/900 |
| 4,223,395 | 9/1980 | Sakaguchi et al. | 365/229 |
| 4,232,377 | 11/1980 | Tallman | 365/229 |
| 4,245,877 | 1/1981 | Auriana | 339/74 R |
| 4,247,603 | 1/1981 | Leffingwell et al. | 429/1 |
| 4,251,604 | 2/1981 | Umemoto | 429/98 |
| 4,288,865 | 9/1981 | Graham | 365/229 |
| 4,326,765 | 4/1982 | Brancaleone | 339/17 CF |
| 4,351,580 | 9/1982 | Kirkman et al. | 339/17 CF |
| 4,383,184 | 5/1983 | McFarland | 307/66 |
| 4,430,724 | 2/1984 | Hamilton et al. | 364/900 |
| 4,443,845 | 4/1984 | Hamilton et al. | 364/200 |
| 4,451,742 | 5/1984 | Aswell | 307/66 |
| 4,457,021 | 6/1984 | Belisomi | 455/186 |
| 4,503,494 | 3/1985 | Hamilton et al. | 364/200 |
| 4,516,218 | 5/1985 | Hamilton et al. | 364/900 |

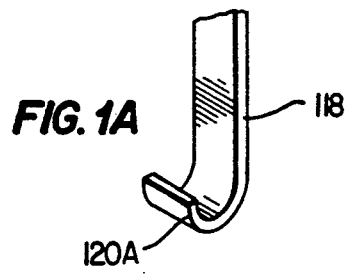
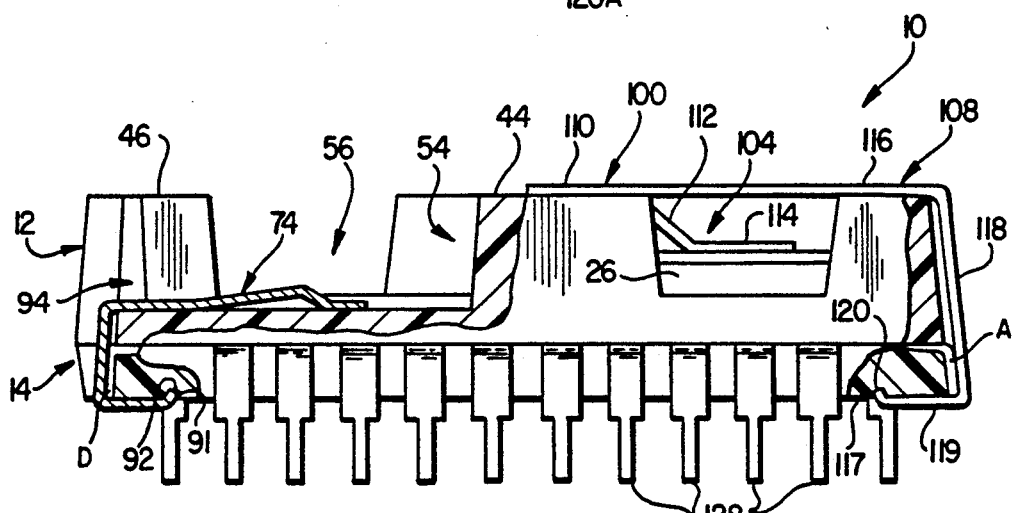
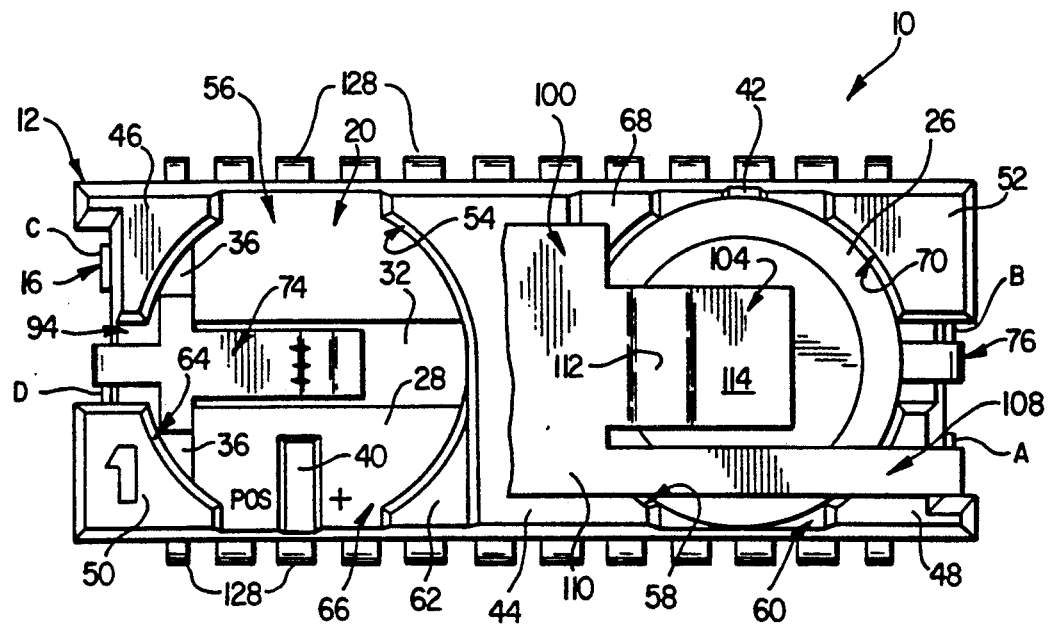

INTEGRATED CIRCUIT PACKAGE WITH BATTERY HOUSING

This is a continuation of application Ser. No. 389,538, filed Aug. 4, 1989 (pending), which is a continuation of Ser. No. 846,510, filed Mar. 28, 1986 (now U.S. Pat. No. 4,998,888), which is a continuation of application Ser. No. 633,374, filed Jul. 23, 1984 (now abandoned), which is a continuation of application Ser. No. 282,183, filed May 27, 1981 (now abandoned).

TECHNICAL FIELD

The present invention pertains to integrated circuits and the packages therefore and more particularly to a package for housing a battery to sustain data states in volatile semiconductor memories.

BACKGROUND OF THE INVENTION

There are many applications involving integrated circuits and in particular integrated circuit memories in which it is desirable to maintain power to the circuit at all times to sustain data states which are stored in the circuit. When power is removed from the circuit critical parameters are often lost due to the volatile memory. In many applications it is necessary to reload these parameters before operations can be continued.

It would thus be advantageous to have an integrated circuit package, particularly for a semiconductor memory, which has structure for inclusion of a battery or batteries so that the data states can be maintained in the memory even if the normal source of power is terminated.

SUMMARY OF THE INVENTION

In its most general form the present invention comprises apparatus for use in conjunction with an integrated circuit. The apparatus includes a package which houses the integrated circuit. A structure is provided for securing at least one battery to the integrated circuit package. Electrical conductors are positioned to extend from the structure securing the batteries to the integrated circuit within the package.

In a more detailed embodiment of the present invention the structure for securing the batteries includes one or more recesses in a surface thereof with each recess adapted for receiving a battery. A member is provided for connection to the structure to extend above the recesses for holding a battery in each of the recesses. A common battery contact is provided on this member for connection to a common terminal of each of the batteries. The common contact extends from the batteries through the lead frame to the integrated circuit. A separate power contact is provided for each of the recesses for connecting the battery therein to the integrated circuit. Therefore, with a plurality of batteries housed in conjunction with the integrated circuit the reliability of the data storage in the circuit is enhanced and the time period for storage of the data is extended. The batteries may be connected in parallel or in series.

The present invention also comprises a method of constructing an apparatus for use in conjunction with an integrated circuit. The method includes the steps of mounting an integrated circuit in a package, securing a battery to the package and electrically interconnecting the integrated circuit and the battery.

BRIEF DESCRIPTION OF THE DRAWINGS

For a more complete understanding of the present invention and the advantages thereof, reference is now made to the following description taken in conjunction with the accompanying drawings in which:

FIG. 1A is a detail of an alternate end for the spring clips used in the present invention;

FIG. 2 is a partial cross-section elevation view of the integrated circuit package and the structure for receiving batteries;

FIG. 3 is a partial cross-section plan view of the structure illustrated in FIG. 2 with the batteries and upper clip removed therefrom to better illustrate the underlying structure.

DETAILED DESCRIPTION OF THE PREFERRED EMBODIMENT

Figure 1:
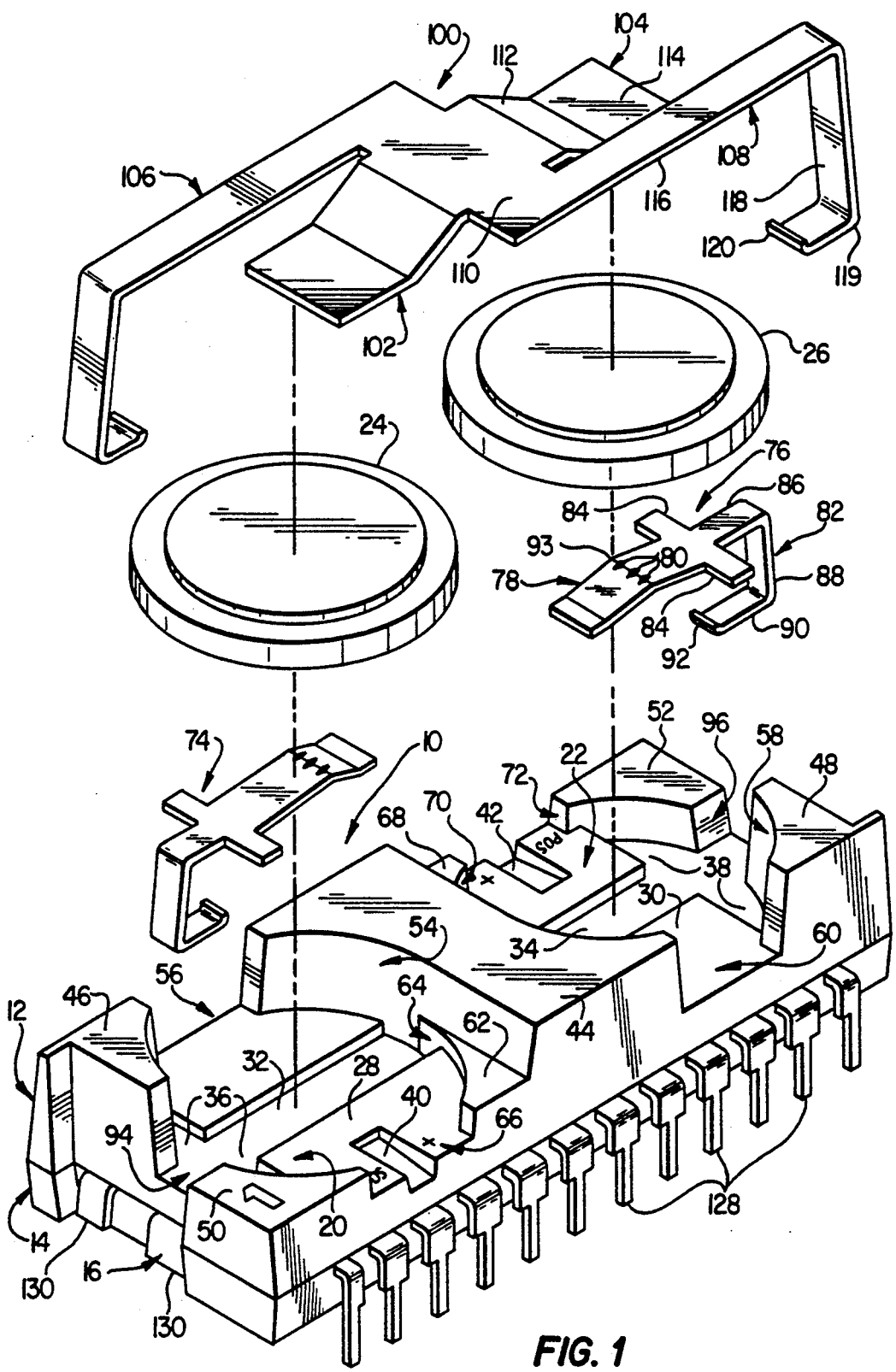
FIG. 1 is an exploded view of a structure for housing a plurality of batteries which are connected to an integrated circuit within an adjacent package and the batteries.

A first embodiment of the present invention is illustrated generally by the reference numeral 10 in FIG. 1. The apparatus 10 includes a rectangular structure 12 which is generally disposed above a dual in-line integrated circuit package 14. The package 14 includes an integrated circuit which communicates with external components through lead frame 16 having leads forming pins and tabs. The lead frame 16 described hereinafter and illustrated in the figures has 24 pins and 3 tabs provided for communication with the integrated circuit. However, the number of leads may vary with the application in which the integrated circuit is to be used.

Recesses 20 and 22 are formed in the upper surface of the structure 12. These recesses are shaped to receive batteries 24 and 26.

Each recess 20 and 22 includes a bottom portion 28 and 30, respectively. The underside of each battery 24 and 26 rests on the bottom portion 28 and 30 as best shown in FIG. 2. Each bottom portion includes an elongate notch 32 or 34 which extends below the plane of the bottom portion. The notch 32 includes arms 36 at the outer portion thereof which include an arcuate portion as best seen in FIG. 3. Notch 34 similarly includes arms 38. Inclined notches 40 and 42 are also formed in the bottom portions. The notches are inclined upwardly towards the center of the bottom portions.

A central dividing member 44 extends upward between the bottom portions. Wall end members 46 and 48 extend upwardly from opposed corners of the structure 12. Lip end members 50 and 52 extend upwardly at the opposite opposed corners of structure 12.

Central dividing member 44 and wall end member 46 define a semi-circular wall 54 surrounding the bottom portion 28. The wall portion is broken by a slot 56 formed between the members 44 and 46. A similar semi-circular wall portion 58 is defined by the members 44 and 48. The portion 48 is broken by slot 60.

The central dividing member 44 includes an extension 62 which defines a semi-circular lip 64 with the lip end member 50. The lip is broken by a slot 66 between the extension 62 and member 50. A similar extension 68 defines lip 70 between the extension and member 52. A slot 72 interrupts the lip between the extension and member.

Bottom spring clips 74 and 76 are positioned within the notches 32 and 34, respectively. Each of the clips 74 and 76 is identical. Therefore, only clip 76 will be described in detail. The clip 76 is formed of a resilient conductor material. The clip includes a battery contact portion 78 having one or more point contacts 80 thereon. The point contacts are designed to provide enhanced ohmic contact with the lower terminal of the battery, i.e. lessen contact resistence.

The clip 76 also includes a fastener portion 82. The fastener portion 82 includes tabs 84, an outwardly extending horizontal piece 86, a downwardly extending vertical piece 88, and an inwardly extending horizontal piece 90. The free end of piece 90 includes an up-turned end 92.

The clips 74 and 76 are mounted in the structure 12 as shown in FIGS. 1-3. The battery contact portion 78 of the clips extend along the notches 32 and 34 with the point contacts 80 centered within the bottom portions. The tabs 84 of clips 74 and 76 extend into the arms 36 and 38, respectively. The pieces 86 extend through slots 94 and 96 in structure 12 and the pieces 88 and 90 extend downwardly and inwardly into contact with individual leads on lead frame 16. The pieces 90 extend inwardly below the package 14 and the ends 92 are preferably received within notches 91 formed in the bottom of the package 14.

It is apparent that the configuration of the clips 74 and 76 will maintain the clips secured to the apparatus 10. The clips are designed so that the point contacts 80 extend above the plane defined by the bottom portions 28 and 30 when nondeformed. A camber 93 in the battery contact portions 78 along the line of contacts 80 insure the contacts project furthest above the bottom portions. In the preferred embodiment, the fastener portions 82 of the clips are also soldered to the lead frame-to prevent removal of the clips and insure. a positive electrical connection.

A top spring clip 100 is provided. The spring clip includes battery contact portions 102 and 104 and fastener portions 106 and 108. The clip 100 is preferably formed from an integral piece of a flexible, conductive material.

The battery contact portions 102 and 104 include a common center 110 and each include a downwardly inclined piece 112 and a horizontal piece 114. The fastener portions 106 and 108 include outwardly extending horizontal pieces 116, vertically downward extending pieces 118 and inwardly extending horizontal pieces 119 terminating in upwardly curved ends 120.

The top spring clip 100 extends over the structure 12 and the pieces 118 and 119 of the fastening portions and ends 120 retain the clip secured to structure 12. Again, recesses 117 may be provided in the package 14 to accept ends 120. An alternate end 120A shown in FIG. 1A may be substituted for pieces 90 and 119 and ends 92 and 120. The end 120A includes a curved portion of constant radius. Portions of pieces 118 and 119 of each fastener portion 106 and 108 are in physical and electrical contact with leads on lead frame 16. In the preferred embodiment, the fastener portions are soldered to the frame to prevent disengagement of the clip and insure electrical contact In operation, the batteries 24 and 26 may be inserted within the apparatus 10 by sliding the batteries over the extensions 62 and 68 and lip end members 50 and 52 for their respective recesses. The placement of the batteries may be determined by a positive sign or language stamped on apparatus 10 as shown. The batteries are tilted to deflect the battery contact portions of the top spring clip upward and the battery contact portions of the bottom spring clips downwardly into their respective notches to permit the batteries to be seated within the recesses.

Once positioned as shown-in FIGS. 2 and 3, the batteries are confined within the recesses by the lips 64 and 70, wall portions 54 and 58 and the battery contact portions of the bottom and top spring clips. The top spring clip 100 is designed to exert a downward force on the batteries through the battery contact portions 102 and 104 exceeding the upward force of the battery contact portions 78 of the bottom spring clips. The excess force is designed to retain the batteries in contact with the bottom portions during the worst shock loading for which the apparatus 10 is designed.

The force exerted by the battery contact portions 78 of the bottom spring clips is sufficient to insure adequate electrical contact between the point contacts 80 and the lower terminal of the batteries. The force top spring clip also provide electrical contact between the top spring clip and the upper terminal of the batteries. It is clear from FIGS. 1 and 3 that the upper terminals of the batteries are common and maybe connected through the top spring clip 100 to the integrated circuit and one or more pins 18. The lower terminal of each battery may be connected to individual or common leads On lead frame 16 leading to the integrated circuit.

In a typical application, an integrated circuit static memory Will be included in the package 14. The integrated circuit is utilized in such a manner that it is necessary to retain the data states stored in the memory even if power if lost to the memory. The batteries 24 and 26 may be connected in parallel through circuitry (not shown) which automatically connects the integrated circuit within package 14 to either one or both of the batteries upon detection of loss of external power. Two batteries in parallel are utilized to improve reliability and to extend the length of time that the data can be stored. The interfacing circuitry between the batteries and the integrated circuit is designed to switch between the best of the two batteries and thereby provide the maximum possible data retention time. The batteries may be connected in series if a high voltage source is needed for a particular application.

If one of the batteries fails, it may be removed independently of the other battery. A thin non-conductive implement may be guided into contact with the battery to be removed through its associated inclined notch 40 or 42. A non-conductive implement is preferred to eliminate the potential for shorting the other battery or damaging the integrated circuit. Urging the implement into contact With the battery tilts the portion of the battery adjacent to the lip upward to permit its removal. If difficulty is encountered, an implement may be inserted through the slot 56 or 60 adjacent to the battery to push the battery from the recess.

The present invention provides several additional significant advantages. The batteries may be inserted or replaced in the apparatus 10 without removal of the apparatus from a printed circuit board or socket. Each of the batteries may be inserted or removed independently of the other battery so that the integrated circuit may be maintained in an active state continuously. The spring clips are securely, is not permanently, secured to the apparatus 10 which prevents loss of the clips during battery insertion or removal. The top spring clip 100 is the only spring exposed to operator induced stresses. The stress on the bottom spring clips does not exceed the stress necessary to urge the clips downward to permit the insertion of the batteries. Therefore, the provision of the stronger spring in the top spring clip reduces the potential for spring overstress. One or more of the spring clips may be connected to pins leading to externals. The externals may provide a trickle charge to retain the batteries in a charged state.

A suggested battery for use in this application is a Model CR-1220 lithium battery manufactured by Sanyo Electric Trading Co., Ltd. of Osaka, Japan. This battery produces a nominal 3.0 volts, has a capacity of 30 mah, a diameter of 12.5 millimeters, a thickness of 2.0 millimeters, a weight of 0.8 grams and can function over the temperature range of −20° C. to +50° C.

In one apparatus constructed from the teaching of the present invention, the apparatus was adapted to receive batteries having a thickness of approximately 78 millimeters. In the constructed apparatus, lips 64 and 70 were designed to have a vertical height of 40 to 50 millimeters and the wall portions 54 and 58 a vertical height of 90 millimeters. The downward force exerted on the battery by the top spring clip 100 in the constructed apparatus was designed to be 1500 grams and the upward spring force exerted by the bottom spring clip on the batteries was designed to be 250 grams, a ratio of 6 to 1. The clips in this constructed apparatus were constructed of berylium copper. This material is designed to retain resiliency across the full semi-conductor temperature range. Phosphor bronze may also be employed as the spring clip material in lower temperature applications.

Figure 4:
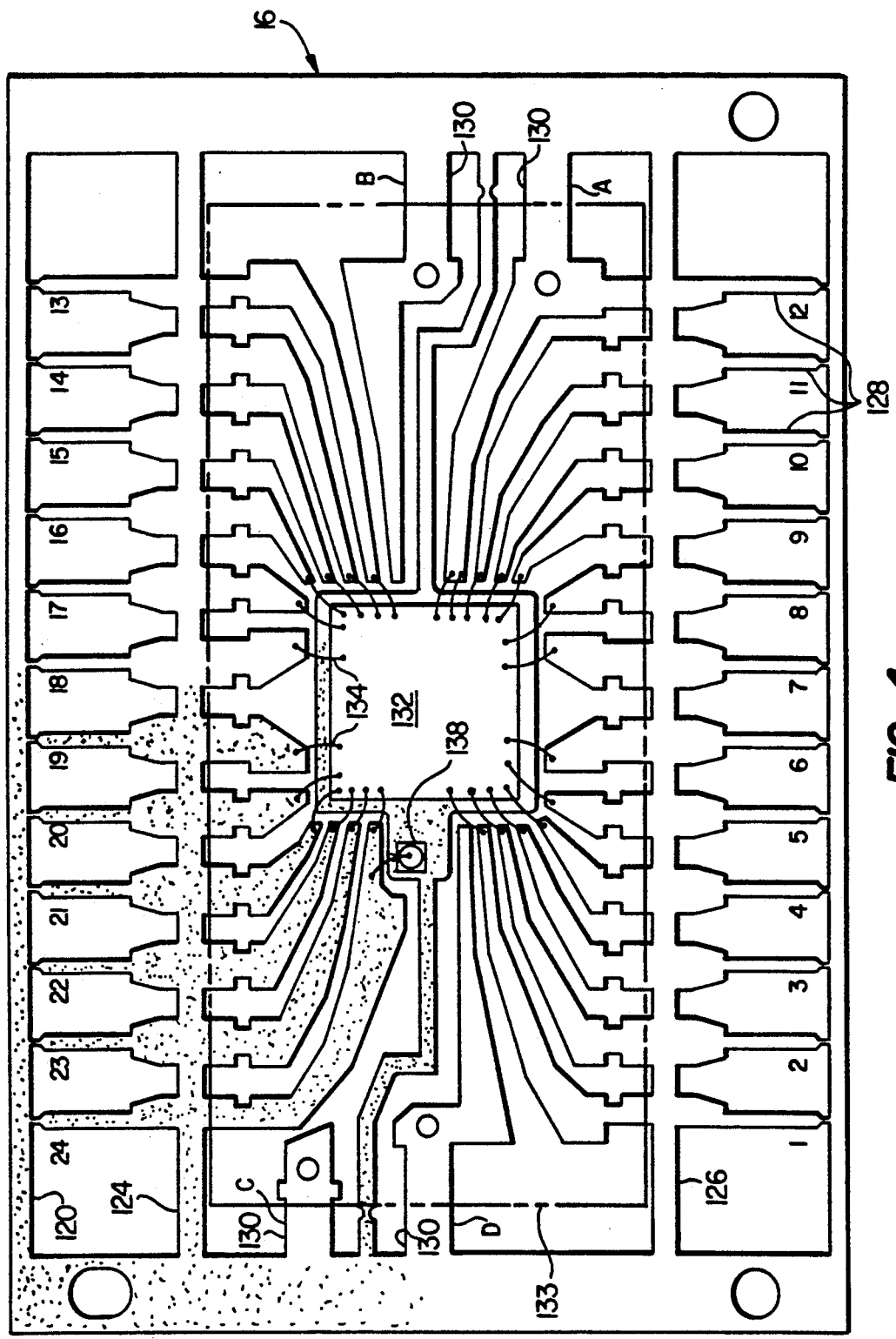
FIG. 4 is a plan view of a lead frame for use in the integrated circuit package.

The detail of lead frame 16 is illustrated in FIG. 4. The lead frame 16 is formed in several stages. The first stage comprises the stamping of the shape shown in FIG. 4 in a conductive material. The body, comprising structure 12 and package 14 may then be molded about the lead frame 16 and CMOS 132. The outside limit of the body is shown by dotted line 133. The body is commonly formed of a plastic. In subsequent steps, the rail 120 is removed and the tie bars 124 and 126 are separated between each pin 128 and tab 130 to form independent leads to the integrated circuit, in this example a CMOS 132. Portions of the pins 128 and tabs 130 extend exterior of the plastic body forming the structure and package.

Twenty four individual pins 128 are provided on the frame 16 for contact with externals. The pins are numbered by convention from 1 to 24 beginning at the lower left pin in FIG. 4 and proceding counterclockwise about the frame. Four tabs 130 are provided and are identified by letters A–D. Each pin and tab contacts terminals in CMOS 132 through small wires 134 bonded between the pins and tabs and contact pads 136 on CMOS 132.

Pin 12 and tab A form one conductor which acts as a common. One end of top spring clip 100 may be in contact with tab A. The opposite end of clip 100 may be secured to tab C, which has no electrical connection to the integrated circuit but aids in the retention of the clip 100 on the apparatus 10. If the batteries are positioned with their negative terminals in contact with top spring clip 100, the common will be the negative terminal. Two wires 134 are employed for connection to CMOS 132 as the current flow at this location may be large.

Tabs B and D are positioned for contact with bottom spring clips 74 and 76. Power for operating CMOS 132 from an external source will be connected to pin 24. A diode 138 is provided to permit external power to flow to the CMOS 132 while blocking flow to the batteries. If the external power is lost, the diode permits energy to flow from the batteries to power the CMOS 132. With diode 138, the batteries cannot be charged by an external power source. However, the design of a circuit permitting the charging of the batteries would be obvious to one skilled in the art.

While apparatus 10 forms one embodiment of the present invention, it will be understood that the shape of the apparatus is related closely to the shape and type of battery employed. For example, the Model BR435 battery manufactured and sold by Matsushita Electric Industrial Company, Ltd. of Japan has an overall tubular shape with the negative terminal formed by a pin extending from one end of the tubular portion and the positive terminal formed by an annular ring adjacent the pin. The apparatus 10 would be modified to accept the tubular shape and clips 74, 76 and 100 modified to contact the terminals and secure the batteries in place in the apparatus.

It will also be understood that the clips may extend to any portion of the apparatus desired. For example, the clips may extend on the side of apparatus 10 to contact one or more pins 128 in the lead frame 16. In addition structure 12 may be secured or mounted to package 14 in any suitable manner.

In summary the present invention comprises an apparatus to house one or more batteries in conjunction with a packaged integrated circuit. The batteries in the housing are connected such that data stored in the integrated circuit is retained for an extended period of time without external power or the operation of the integrated circuit can continue for an extended period of time without external power.

Although a single embodiment of the invention has been illustrated in the accompanying Drawings and described in the foregoing Detailed Description, it will be understood that the invention is not limited to the embodiments disclosed, but is capable of numerous rearrangements, modifications and substitutions without departing from the scope of the invention.

What is claimed:

APPENDIX A

```
/***********************************************************/
/*                                                         */
/*                      QUICKBIT                           */
/*                                                         */
/* Program to transform LADAR data to a different point-of-view */
/* The  3-D position of the target is determined for each pixel. */
/* The projection to a new point-of-view determines a pixel-by pixel */
/* mapping of the LADAR intensity to the recon PHOTO coordinates. */
/*                                                         */
/* By: B. Pettitt     April 22, 1992 - June 10, 1992       */
/* and D. McArthur    April 22, 1992                       */
/*                                                         */
/* LTV Aerospace & Defense                                 */
/***********************************************************/
```

```c
#include <stdio.h>
#include <math.h>
include <stdlib.h>
include <time.h> include "qh.def"   /* <-- function prototypes */

/* Macros and constants */
#define EDGE_COLOR    255
#define ARTIF_COLOR   255
#define GET_ANSWER    c = getch();answer[0] = c;if (answer[0] != 'n' && answer[0] != 'N')
#define GET_FILENAME  printf("Enter filename: ");scanf ("%s", filename );
#define INTEGER 2
#define BYTE    1

/**********************************************************/
/********************  START: MAIN() **********************/
/**********************************************************/
void main( )
{   int    i, j, k, del;
    int    **edge, **i_edge, **r_edge, **edgecomb, **lines;
    int    **ithin_edge, **rthin_edge;
    int    **recon_edge, **art_regions, **thin_edges, **inten_new_sub;
    int    ncols_ladar, nrows_ladar, ncols_recon, nrows_recon;
    int    **inten_new, **inten_croshair, **z_buf, **recon, **inten_new_edge;
    int    **inten, **range;
    int    **ladar_label_y, **ladar_label_x, edgecount;
    int    replength, intthresh, rngthresh;
    int    c, imag, div, res;
    int    slide,start1col,start1row,start2col,start2row;
    int    ladar_x, ladar_y, recon_x, recon_y;
    int    size;
    char   answer[1], filename[80];
    float  overscan, **re_mat, **se_mat, **pr_mat, deg_to_radian;
    float  pos_sen[3], rr[3];
    float  yaw_sen, yaw_recon,pitch_sen,pitch_recon,roll_sen,roll_recon;
    float  fov_sen, fov_recon, k_col, k_row, kk_col, kk_row;
    char   fln_int[80], fln_rng[80], fln_recon[80];
    FILE   *parms_fp;

/* read in parameter data file */
    if ((parms_fp = fopen("parms.dat", "r")) == NULL)
    {   printf("\nError opening parameter data file: parms.dat\n");
        exit(1);
    }
    fscanf(parms_fp,"%f %*s %f %*s %f %*s %f %*s %f %*s %f %*s",
        &yaw_sen, &pitch_sen, &roll_sen, &yaw_recon, &pitch_recon,&roll_recon );
    fscanf(parms_fp,"%f %*s %f %*s %f %*s %d %*s %d %*s %d %*s %d %*s",
        &pos_sen[0], &pos_sen[1], &pos_sen[2],
        &ncols_ladar, &nrows_ladar, &ncols_recon, &nrows_recon );
    fscanf(parms_fp,"%f %*s %d %*s %d %*s %d %*s %d %*s %d %*s
                    %*s %*s %*s %*s",
                    &overscan, &replength, &intthresh, &rngthresh,
                    &recon_x, &recon_y,fln_int, fln_rng, fln_recon );
fclose (parms_fp);

/****** initialize constants ******/
deg_to_radian = 3.1415926/180.0;
k_row = k_col = 3.5 * 3.14159 /(180.0*nrows_ladar);  /* SENSOR pix fov */
kk_col = kk_row = 1.0/(0.7*k_row);                   /* 1/(RECON pix fov) */

/****** dynamic memory allocation ******/
re_mat         = (float **) memory(3,3,4);
se_mat         = (float **) memory(3,3,4);
pr_mat         = (float **) memory(3,3,4);

inten          = (int **) memory(ncols_ladar,nrows_ladar,4);
range          = (int **) memory(ncols_ladar,nrows_ladar,4);
i_edge         = (int **) memory(ncols_ladar,nrows_ladar,4);
r_edge         = (int **) memory(ncols_ladar,nrows_ladar,4);
ithin_edge     = (int **) memory(ncols_ladar,nrows_ladar,4);
rthin_edge     = (int **) memory(ncols_ladar,nrows_ladar,4);
thin_edges     = (int **) memory(ncols_ladar,nrows_ladar,4);
lines          = (int **) memory(ncols_ladar,nrows_ladar,4);

inten_new_sub  = (int **) memory(ncols_recon/2,nrows_recon/2,4);

edge           = (int **) memory(ncols_recon,nrows_recon,4);
recon          = (int **) memory(ncols_recon,nrows_recon,4);
inten_new      = (int **) memory(ncols_recon,nrows_recon,4);
inten_new_edge = (int **) memory(ncols_recon,nrows_recon,4);
edgecomb       = (int **) memory(ncols_recon,nrows_recon,4);
recon_edge     = (int **) memory(ncols_recon,nrows_recon,4);
```

```
art_regions  = (int **) memory(ncols_recon,nrows_recon,4);
z_buf        = (int **) memory(ncols_recon,nrows_recon,4);
ladar_label_y= (int **) memory(ncols_recon,nrows_recon,4);
ladar_label_x= (int **) memory(ncols_recon,nrows_recon,4);

/***** initialize matrices to a constant *****/
_Matrix_Init(ncols_ladar,nrows_ladar,  0,inten);
_Matrix_Init(ncols_ladar,nrows_ladar,  0,range);
_Matrix_Init(ncols_ladar,nrows_ladar,  0,i_edge);
_Matrix_Init(ncols_ladar,nrows_ladar,  0,r_edge);
_Matrix_Init(ncols_ladar,nrows_ladar,  0,ithin_edge);
_Matrix_Init(ncols_ladar,nrows_ladar,  0,rthin_edge);
_Matrix_Init(ncols_ladar,nrows_ladar,  0,thin_edges);
_Matrix_Init(ncols_ladar,nrows_ladar,  0,lines);

_Matrix_Init(ncols_recon/2,nrows_recon/2,0,inten_new_sub);

_Matrix_Init(ncols_recon,nrows_recon,  0,edge);
_Matrix_Init(ncols_recon,nrows_recon,  0,recon);
_Matrix_Init(ncols_recon,nrows_recon,  0,inten_new);
_Matrix_Init(ncols_recon,nrows_recon,  0,inten_new_edge);
_Matrix_Init(ncols_recon,nrows_recon,  0,edgecomb);
_Matrix_Init(ncols_recon,nrows_recon,  0,recon_edge);
_Matrix_Init(ncols_recon,nrows_recon,  0,art_regions);
_Matrix_Init(ncols_recon,nrows_recon,70000,z_buf);
_Matrix_Init(ncols_recon,nrows_recon, nrows_ladar/2, ladar_label_y);
_Matrix_Init(ncols_recon,nrows_recon, ncols_ladar/2, ladar_label_x);

/**** SENSOR position and orientation paramerers *****/
yaw_sen     = yaw_sen     * deg_to_radian;
pitch_sen   = pitch_sen   * deg_to_radian;
roll_sen    = roll_sen    * deg_to_radian;
yaw_recon   = yaw_recon   * deg_to_radian;
pitch_recon = pitch_recon * deg_to_radian;
roll_recon  = roll_recon  * deg_to_radian;

/***** generate SENSOR and RECON rotation matrices *****/
r_rot(yaw_recon, pitch_recon, roll_recon, re_mat);
r_rot(yaw_sen, pitch_sen, roll_sen, se_mat);
Mult_Tran_Matrix_3x3(re_mat, se_mat, pr_mat);
Mult_Tran_Matrix_3x1(re_mat, pos_sen, rr);

/***** read intensity and range LADAR images *****/
read_image(fln_int, ncols_ladar, nrows_ladar, inten, 1);
read_image(fln_rng, ncols_ladar, nrows_ladar, range, 2);
eliminate_water(inten, range, ncols_ladar, nrows_ladar);

/***** read original recon photo image       *****/
read_image(fln_recon, ncols_recon, nrows_recon, recon, 1);

printf("Display MISSLE VIEW INTENSITY and RANGE Images? (y/n)\n");
GET_ANSWER
{ disp_2images(ncols_ladar,nrows_ladar,inten,150,50,ncols_ladar,
              nrows_ladar,range,150,250,slide=0);
  write_image(inten, ncols_ladar, nrows_ladar,
              size=INTEGER, "bunint.img");
  write_image(range, ncols_ladar, nrows_ladar,
              size=INTEGER, "bunrng.img");
}

/*************************************************************/
/***** determine array size needed for mapping *****/
map_corners(ncols_ladar, nrows_ladar, ncols_recon, nrows_recon,
           pr_mat, rr, k_col, k_row, kk_col, kk_row, range);

/***** map ladar intensity to recce viewpoint *****/
map_visible(overscan, ncols_ladar, nrows_ladar, ncols_recon, nrows_recon,
           pr_mat, rr, k_col, k_row, kk_col, kk_row,
           inten, inten_new, range, z_buf, ladar_label_y, ladar_label_x );

printf("MEDIAN FILTER generated recon? (y/n)\n");
GET_ANSWER
    median(inten_new, ncols_recon, nrows_recon);

printf("Display ORIGINAL LADAR INTENSITY and GENERATED RECON? (y/n)\n");
GET_ANSWER
```

```
{ disp_2images(ncols_ladar,nrows_ladar, inten, 1, 160,
              ncols_recon, nrows_recon, inten_new, 342, 1, slide=0);
  write_image(recon, ncols_recon, nrows_recon,
              size=INTEGER, "labrecc.img");
  write_image(inten_new, ncols_recon, nrows_recon,
              size=INTEGER, "gbunrecc.img");
}
printf("GAP FILL generated recon? (y/n)\n");
GET_ANSWER
{ gapfill(inten_new, ncols_recon, nrows_recon);
  disp_2images(ncols_ladar,nrows_ladar, inten, 1, 160, ncols_recon,
              nrows_recon, inten_new, 342, 1, slide=0);
  write_image(inten_new, ncols_recon, nrows_recon,
              size=INTEGER, "gbunrecc.img");
}

/***************************************************************/
printf("Generate ARTIFICIAL REGIONS? (y/n)\n");
GET_ANSWER
{
  /**** find EDGES from LADAR imagery -- generate binary image ***/
  edgegrad3(inten, i_edge, ncols_ladar, nrows_ladar, 2, 1, intthresh);
  edgegrad3(range, r_edge, ncols_ladar, nrows_ladar, 2, 1, rngthresh);

printf("Display LADAR INTENSITY and EDGE Images? (y/n)\n");
  GET_ANSWER
      disp_2images(ncols_ladar, nrows_ladar, inten, 1,160,ncols_ladar,
              nrows_ladar, i_edge, 342,160,slide=0);

printf("Display LADAR RANGE and EDGE Images? (y/n)\n");
  GET_ANSWER
      disp_2images(ncols_ladar, nrows_ladar, range, 1,160,ncols_ladar,
              nrows_ladar, r_edge, 342,160,0);

edge_thin(i_edge, ncols_ladar, nrows_ladar, ithin_edge );
  edge_thin(r_edge, ncols_ladar, nrows_ladar, rthin_edge );

printf("Display INTENSITY and THINNED INTENSITY Images? (y/n)\n");
  GET_ANSWER
      disp_2images(ncols_ladar, nrows_ladar, i_edge, ncols_ladar,
              nrows_ladar, ithin_edge, 0);

printf("Display RANGE and THINNED RANGE Images? (y/n)\n");
  GET_ANSWER
      disp_2images(ncols_ladar, nrows_ladar, r_edge, ncols_ladar,
              nrows_ladar, rthin_edge, 0);

/* combine edges from LADAR intensity and range */
  image_OR(ithin_edge, rthin_edge, ncols_ladar, nrows_ladar, thin_edges);

printf("Display COMBINED Edge Image (y/n)\n");
  GET_ANSWER
      disp_2images(ncols_ladar, nrows_ladar, inten, ncols_ladar,
              nrows_ladar, thin_edges, 0);

find_lines( thin_edges, ncols_ladar, nrows_ladar, lines );

printf("Display LINES Image (y/n)\n");
  GET_ANSWER
      disp_lines( lines, ncols_ladar, nrows_ladar );

/* define artificial (hidden) regions using */
  /* adjacent vertical edge points            */
  map_artificial_V(ncols_ladar, nrows_ladar, ncols_recon, nrows_recon,
              pr_mat, rr, k_col, k_row, kk_col, kk_row,
              art_regions, range, z_buf, thin_edges, replength );

/* define artificial (hidden) regions using */
  /* adjacent horizontal edge points          */
  map_artificial_H(ncols_ladar, nrows_ladar, ncols_recon, nrows_recon,
              pr_mat, rr, k_col, k_row, kk_col, kk_row,
              art_regions, range, z_buf, thin_edges, replength );

printf("Median filter ARTIFICIAL REGIONS? (y/n)\n");
  GET_ANSWER
  median(art_regions, ncols_recon, nrows_recon);

/* combine edges from LADAR intensity and range */
  image_OR(ithin_edge, rthin_edge, ncols_ladar, nrows_ladar, thin_edges);

free(ithin_edge);
  free(rthin_edge);
```

```
        printf("Display COMBINED EDGE and ARTIFICIAL REGION Image? (y/n)\n");
        GET_ANSWER
            disp_2images(ncols_ladar,nrows_ladar, thin_edges, ncols_recon,
                         nrows_recon, art_regions,slide=0);

printf("Display ORIGINAL RECON and GENERATED RECON w/ ARTIFICIAL
                REGIONS? (y/n)\n");
        GET_ANSWER
        { Image_OR(art_regions, inten_new, ncols_recon, nrows_recon,
                  edgecomb );
            disp_2images(ncols_recon,nrows_recon, recon, 1,160,
                         ncols_recon,nrows_recon, edgecomb, 345, 160, slide=0);
            write_image(edgecomb, ncols_recon, nrows_recon,
                        size=INTEGER, "bunart.img");
        }
    } /***** end map artificial block *****/
    /*************************************************************/ printf("Display ORIGINAL RECON and GENERATED RECON w/o
            ARTIFICIAL REGIONS? (y/n)\n");
    GET_ANSWER
    { disp_2images(ncols_recon,nrows_recon, recon, 1,110,
                   ncols_recon,nrows_recon, inten_new, 305,1,slide=0);
        write_image(recon, ncols_recon, nrows_recon,
                    size=INTEGER, "labrecc.img");
        write_image(inten_new, ncols_recon, nrows_recon,
                    size=INTEGER, "qbunrecc.img");
    } printf("Generate EDGES for ORIGINAL RECON image? (y/n)\n");
    GET_ANSWER
    {
        edggrad3(recon, recon_edge, ncols_recon, nrows_recon,
                 1, 1, intthresh/2);
        edggrad3(inten_new, inten_new_edge, ncols_recon, nrows_recon,
                 1, 1, intthresh/2);
        edge_thin(recon_edge, ncols_recon, nrows_recon, recon_edge );
        edge_thin(inten_new_edge, ncols_recon, nrows_recon, inten_new_edge );
        disp_2images(ncols_recon, nrows_recon, recon_edge, 1,110,
                     ncols_recon, nrows_recon, inten_new_edge, 305, 1,slide=0);
        write_image(recon_edge, ncols_recon, nrows_recon,
                    size=INTEGER, "labredge.img");
        write_image(inten_new_edge, ncols_recon, nrows_recon,
                    size=INTEGER, "labiedge.img");

printf("Display EDGE OVERLAY and EDGE MATCH image? (y/n)\n");
        GET_ANSWER { _Matrix_Init(ncols_recon,nrows_recon,0,edge);
            _Matrix_Init(ncols_recon,nrows_recon,0,edgecomb);
            Image_OR(recon_edge, inten_new_edge, ncols_recon, nrows_recon, edge);
            image_AND(recon_edge, inten_new_edge, ncols_recon,
                      nrows_recon, edgecomb);
            disp_2images(ncols_recon,nrows_recon,edge, 1,110,
                         ncols_recon, nrows_recon, edgecomb, 305, 1, slide=0);
            write_image(edge, ncols_recon, nrows_recon,
                        size=INTEGER, "edgecomb.Img");
            write_image(edgecomb, ncols_recon, nrows_recon,
                        size=INTEGER, "labmatch.img");
        }
    } printf("Display Crosshairs? (y/n)\n");
    GET_ANSWER
    { display_crosshairs(ncols_ladar,nrows_ladar, inten, ncols_recon,
                         nrows_recon, inten_new, slide=2,ladar_label_y,
                         ladar_label_x,recon_y,recon_x);

answer[0]='y';
        while (answer[0]!='n' && answer[0]!='N')
        { printf("Enter new RECON HIT POINT? (y/n)\n");
            GET_ANSWER
            { printf("Old Hitpoint at X,Y = %d,%d\n",recon_x,recon_y);
                printf("Enter new X,Y hitpoint in %dx%d recon
                        photo:\n",nrows_recon,ncols_recon);
                scanf("%d,%d",&recon_x,&recon_y);

display_crosshairs(ncols_ladar, nrows_ladar, inten, ncols_recon, nrows_recon,
                                   inten_new, slide=2, ladar_label_y,ladar_label_x,
                                   recon_y,recon_x);
            }
```

```
      }
   } free(re_mat);
   free(se_mat);
   free(pr_mat);
   free(inten);
   free(range);

free(recon);

free(inten_new);
   free(edge);

free(inten_croshair);
   free(edgecomb);
   free(recon_edge);
   free(art_regions);
   free(z_buf);
   free(ladar_label_y);
   free(ladar_label_x);

printf("\nProgram successfully completed.\n");

} /****************** END: MAIN() ************************/
/***********************************************************/
/***********************************************************/
/************ START: Subroutine MAP_VISIBLE() *************/
/***********************************************************/
void map_visible(float overscan, int ncols_ladar, int nrows_ladar,
        int ncols_recon, int nrows_recon,
        float **pr_mat, float *rr,
        float k_col, float k_row, float kk_col, float kk_row,
        int **inten, int **inten_new, int **range, int **z_buf,
        int **ladar_label_y, int **ladar_label_x )
{ int i,j ,ir,jr,ir_cen,jr_cen,oldi ;
  float fli, flj, rt[3], rcol[3], rc[3], jpix, mtk[3], rng ;
  printf("Please wait...mapping VISIBLE regions...\n");
  ir_cen = ncols_recon/2;
  jr_cen = nrows_recon/2;
  /**** For each pixel, ---in small angle approximation ****/
  /**** compute line-of-sight vector in LADAR coordinates ****/
  for (fli=0; fli<ncols_ladar; fli=fli+overscan)
  {    i = (int) fli;
     rt[1] = (fli-ncols_ladar/2) * k_col;
     /** transform line-of-sight to recon photo coords **/
     rcol[0] = pr_mat[0][1] * rt[1] + pr_mat[0][2];
     rcol[1] = pr_mat[1][1] * rt[1] + pr_mat[1][2];
     rcol[2] = pr_mat[2][1] * rt[1] + pr_mat[2][2];
     jpix =(float)nrows_ladar/2;
     mtk[0] = pr_mat[0][0]*k_row;
     mtk[1] = pr_mat[1][0]*k_row;
     mtk[2] = pr_mat[2][0]*k_row;
     for(flj=0; flj<nrows_ladar; flj=flj+overscan)
     {  j = (int)flj;
        rng = 20 + range[i][j];
        rt[0] = (flj-jpix);
        rc[0] = rr[0] + rng *( mtk[0]*rt[0] + rcol[0] );
        rc[1] = rr[1] + rng *( mtk[1]*rt[0] + rcol[1] );
        rc[2] = rr[2] + rng *( mtk[2]*rt[0] + rcol[2] );
        /** project onto recon plane **/
        if (rc[2]>0.0)
        { ir = ir_cen + kk_col * rc[1]/rc[2];
          jr = jr_cen + kk_row * rc[0]/rc[2];
          if   ( (0<ir) && (ir<ncols_recon) )      /*clip*/
          { if ( (0<jr) && (jr<nrows_recon) )
            { if ( rc[2] < z_buf[ir][jr] )
              { inten_new[ir][jr] = inten[i][j];
                z_buf[ir][jr] = rc[2];
                ladar_label_y[ir][jr] = i;
                ladar_label_x[ir][jr] = j;
              }
            }
          }
        }
     }
  }
  return;
} /************ END: subroutine MAP_VISIBLE()*************/
```

```c
/***************************************************************/
/************** START: Subroutine MAP_CORNERS() ****************/
/***************************************************************/
void map_corners(int ncols_ladar, int nrows_ladar,
        int ncols_recon, int nrows_recon,
        float **pr_mat, float *rr,
        float k_col, float k_row, float kk_col, float kk_row,
        int **range)

{ int i,j ,ir,jr,ir_cen,jr_cen,oldi ;
  float fli, flj, rt[3], rcol[3], rc[3], jpix, mtk[3], rng ;
  int col_max, row_max, col_min, row_min;
  int nrows, ncols; /* returned as necessary array size */
  int corner[4][4];

printf("ncols_ladar = %d, nrows_ladar = %d\n", ncols_ladar,
         nrows_ladar);

printf("Please wait...determining VISIBLE
          mapping corners...\n");

ir_cen = 1024;
  jr_cen = 1024;

/**** For each pixel, ---in small angle approximation ****/
  /*** compute line-of-sight vector in LADAR coordinates ****/

/* map upper left pixel */
  fli = 0;
  flj = 0;
  i = (int) fli;
  j = (int) flj;
  rt[1] = (fli-ncols_ladar/2) * k_col;
  /** transform line-of-sight to recon photo coords **/
  rcol[0] = pr_mat[0][1] * rt[1] + pr_mat[0][2];
  rcol[1] = pr_mat[1][1] * rt[1] + pr_mat[1][2];
  rcol[2] = pr_mat[2][1] * rt[1] + pr_mat[2][2];
  jpix =(float)nrows_ladar/2;
  mtk[0] = pr_mat[0][0]*k_row;
  mtk[1] = pr_mat[1][0]*k_row;
  mtk[2] = pr_mat[2][0]*k_row;

rng = 20 + range[i][j];
  rt[0] = (flj-jpix);
  rc[0] = rr[0] + rng *( mtk[0]*rt[0] + rcol[0] );
  rc[1] = rr[1] + rng *( mtk[1]*rt[0] + rcol[1] );
  rc[2] = rr[2] + rng *( mtk[2]*rt[0] + rcol[2] );
  /** project onto recon plane **/
  corner[0][0] = ir_cen + kk_col * rc[1]/rc[2];
  corner[0][1] = jr_cen + kk_row * rc[0]/rc[2];

/* map upper right pixel */
  fli = 0;
  flj=nrows_ladar-1;
  i = (int) fli;
  j = (int) flj;
  rt[1] = (fli-ncols_ladar/2) * k_col;
  /** transform line-of-sight to recon photo coords **/
  rcol[0] = pr_mat[0][1] * rt[1] + pr_mat[0][2];
  rcol[1] = pr_mat[1][1] * rt[1] + pr_mat[1][2];
  rcol[2] = pr_mat[2][1] * rt[1] + pr_mat[2][2];
  jpix =(float)nrows_ladar/2;
  mtk[0] = pr_mat[0][0]*k_row;
  mtk[1] = pr_mat[1][0]*k_row;
  mtk[2] = pr_mat[2][0]*k_row;

rng = 20 + range[i][j];
  rt[0] = (flj-jpix);
  rc[0] = rr[0] + rng *( mtk[0]*rt[0] + rcol[0] );
  rc[1] = rr[1] + rng *( mtk[1]*rt[0] + rcol[1] );
  rc[2] = rr[2] + rng *( mtk[2]*rt[0] + rcol[2] );
  /** project onto recon plane **/
  corner[0][2] = ir_cen + kk_col * rc[1]/rc[2];
  corner[0][3] = jr_cen + kk_row * rc[0]/rc[2];

/* map lower left pixel */
  fli = ncols_ladar-1;
  flj = 0;
  i = (int) fli;
  j = (int) flj;
  rt[1] = (fli-ncols_ladar/2) * k_col;
  /** transform line-of-sight to recon photo coords **/
```

```c
    rcol[0] = pr_mat[0][1] * rt[1] + pr_mat[0][2];
    rcol[1] = pr_mat[1][1] * rt[1] + pr_mat[1][2];
    rcol[2] = pr_mat[2][1] * rt[1] + pr_mat[2][2];
    jpix =(float)nrows_ladar/2;
    mtk[0] = pr_mat[0][0]*k_row;
    mtk[1] = pr_mat[1][0]*k_row;
    mtk[2] = pr_mat[2][0]*k_row;

rng = 20 + range[i][j];
    rt[0] = (fli-jpix);
    rc[0] = rr[0] + rng *( mtk[0]*rt[0] + rcol[0] );
    rc[1] = rr[1] + rng *( mtk[1]*rt[0] + rcol[1] );
    rc[2] = rr[2] + rng *( mtk[2]*rt[0] + rcol[2] );
    /****  project onto recon plane ****/
    corner[1][0] = ir_cen + kk_col * rc[1]/rc[2];
    corner[1][1] = jr_cen + kk_row * rc[0]/rc[2];

/* map lower right pixel */
    fli = ncols_ladar-1;
    flj = nrows_ladar-1;
    i = (int) fli;
    j = (int) flj;
    rt[1] = (fli-ncols_ladar/2) * k_col;
    /****  transform line-of-sight to recon photo coords ****/
    rcol[0] = pr_mat[0][1] * rt[1] + pr_mat[0][2];
    rcol[1] = pr_mat[1][1] * rt[1] + pr_mat[1][2];
    rcol[2] = pr_mat[2][1] * rt[1] + pr_mat[2][2];
    jpix =(float)nrows_ladar/2;
    mtk[0] = pr_mat[0][0]*k_row;
    mtk[1] = pr_mat[1][0]*k_row;
    mtk[2] = pr_mat[2][0]*k_row;

rng = 20 + range[i][j];
    rt[0] = (flj-jpix);
    rc[0] = rr[0] + rng *( mtk[0]*rt[0] + rcol[0] );
    rc[1] = rr[1] + rng *( mtk[1]*rt[0] + rcol[1] );
    rc[2] = rr[2] + rng *( mtk[2]*rt[0] + rcol[2] );
    /****  project onto recon plane ****/
    corner[1][2] = ir_cen + kk_col * rc[1]/rc[2];
    corner[1][3] = jr_cen + kk_row * rc[0]/rc[2];

col_max = -100000;
    row_max = -100000;
    col_min =  100000;
    row_min =  100000;

if (corner[0][0] > col_max) col_max = corner[0][0];
    if (corner[0][0] < col_min) col_min = corner[0][0];

if (corner[0][1] > row_max) row_max = corner[0][1];
    if (corner[0][1] < row_min) row_min = corner[0][1];

if (corner[0][2] > col_max) col_max = corner[0][2];
    if (corner[0][2] < col_min) col_min = corner[0][2];

if (corner[0][3] > row_max) row_max = corner[0][3];
    if (corner[0][3] < row_min) row_min = corner[0][3];

if (corner[1][0] > col_max) col_max = corner[1][0];
    if (corner[1][0] < col_min) col_min = corner[1][0];

if (corner[1][1] > row_max) row_max = corner[1][1];
    if (corner[1][1] < row_min) row_min = corner[1][1];
    if (corner[1][2] > col_max) col_max = corner[1][2];
    if (corner[1][2] < col_min) col_min = corner[1][2];
    if (corner[1][3] > row_max) row_max = corner[1][3];
    if (corner[1][3] < row_min) row_min = corner[1][3];
    ncols = col_max - col_min;
    nrows = row_max - row_min;
    printf("Calculated: ncols_recon = %d,
        nrows_recon = %d\n",ncols, nrows);

return;
} /******** END: subroutine MAP_CORNERS() ***************/ define ARTIF_COLOR  255
/***********************************************************/
/************  START: Subroutine MAP_ARTIFICIAL_V() ********/
/***********************************************************/
void map_artificial_V(int ncols_ladar, int nrows_ladar,
        int ncols_recon, int nrows_recon,
        float **pr_mat, float *rr,
        float k_col, float k_row, float kk_col, float kk_row,
```

```
       int **art_regions, int **range, int **z_buf,
       int **edge, int replength  )
{ int i,j ,ir,jr,ir_cen,jr_cen,ir1,ir2,jr1,jr2;
  int jtemp, jpre, jfil, rc;
  float fli,flj, rt[3],rcol[3], rc1[3],rc2[3], mtk[3], rng;
  int point1_inside, point2_inside;

printf("Please wait...generating ARTIFICIAL regions...\n");

/**** Initialize variables ****/
  ir_cen = ncols_recon/2;    /* center of recon photo */
  jr_cen = nrows_recon/2;

/**** For each pixel, ---in small angle approximation  *******/
  /**** compute line-of-sight vector in SENSOR coordinates *******/
  for (i=2; i<ncols_ladar-2; i++)   /* scan along col starting at col 2 */
  { rt[1] = (i-ncols_ladar/2) * k_col;
    /******  transform line-of-sight to recon photo coordinates ******/
    rcol[0] = pr_mat[0][1] * rt[1] + pr_mat[0][2];
    rcol[1] = pr_mat[1][1] * rt[1] + pr_mat[1][2];
    rcol[2] = pr_mat[2][1] * rt[1] + pr_mat[2][2];

mtk[0] = pr_mat[0][0]*k_row;
    mtk[1] = pr_mat[1][0]*k_row;
    mtk[2] = pr_mat[2][0]*k_row;

for(j=2; j<nrows_ladar-2; j++)   /*** start line processing ****/
    { jpre = j-1;                    /* save for next pass*/
      if (edge[i][j]>0)              /* test for edges*/
      { /* map current pixel*/
        /* correction for sensor dynamics */
        rng = 20 + range[i][j];
        rt[0] = (float)(j-nrows_ladar/2);
        /* mapping x,y,z of first point */
        rc1[0] = rr[0] + rng *( mtk[0]*rt[0] + rcol[0] );
        rc1[1] = rr[1] + rng *( mtk[1]*rt[0] + rcol[1] );
        rc1[2] = rr[2] + rng *( mtk[2]*rt[0] + rcol[2] );

/* map previous pixel*/
        rng = 20 + range[i][jpre];
        rt[0] = (float)(jpre-nrows_ladar/2);
        /* mapping x,y,z of second point */
        rc2[0] = rr[0] + rng *( mtk[0]*rt[0] + rcol[0] );
        rc2[1] = rr[1] + rng *( mtk[1]*rt[0] + rcol[1] );
        rc2[2] = rr[2] + rng *( mtk[2]*rt[0] + rcol[2] );

/******  project onto recon plane ******/
        if( (rc1[2]>0.0) && (rc2[2]>0.0) )
        { ir1 = ir_cen +  kk_col * rc1[1]/rc1[2];
          jr1 = jr_cen +  kk_row * rc1[0]/rc1[2];
          ir2 = ir_cen +  kk_col * rc2[1]/rc2[2];
          jr2 = jr_cen +  kk_row * rc2[0]/rc2[2];

point1_inside= ( (0<ir1) && (ir1<ncols_recon)
                        && (0<jr1) && (jr1<nrows_recon) );
          point2_inside= ( (0<ir2) && (ir2<ncols_recon)
                        && (0<jr2) && (jr2<nrows_recon) );

if (point1_inside && point2_inside)
          { for(jfil=0; jfil<replength; jfil++)
            { ir = ir1 + ((ir2-ir1)*jfil)/replength;
              jr = jr1 + ((jr2-jr1)*jfil)/replength;
              rc = rc1[2] +   ((rc2[2]-rc1[2])*jfil)/replength;
              if ( rc < z_buf[ir][jr] )
              { art_regions[ir][jr] = ARTIF_COLOR;
                z_buf[ir][jr] = rc;
              }
            }
          }
          else if (point1_inside && (! point2_inside))
          { for(jfil=0; jfil<replength; jfil++)
            { ir = ir1 + ((ir2-ir1)*jfil)/replength;
              jr = jr1 + ((jr2-jr1)*jfil)/replength;

if ( (0<ir) && (ir<ncols_recon) && (0<jr)
                   && (jr<nrows_recon) )
              { rc = rc1[2] +  ((rc2[2]-rc1[2])*jfil)/replength;
                if ( rc < z_buf[ir][jr] )
                { art_regions[ir][jr] = ARTIF_COLOR;
                  z_buf[ir][jr] = rc;
                }
              }
            }
          }
```

```
          else
              jfil=replength;
      }
  }
  else if (point2_inside && (! point1_inside))
  { for(jfil=0; jfil<replength; jfil++)
      { ir = ir2 + ((ir1-ir2)*jfil)/replength;
        jr = jr2 + ((jr1-jr2)*jfil)/replength;

if ( (0<ir) && (ir<ncols_recon) && (0<jr)
             && (jr<nrows_recon) )
        { rc = rc2[2] + ((rc1[2]-rc2[2])*jfil)/replength;
          if ( rc < s_buf[ir][jr] )
          { art_regions[ir][jr] = ARTIF_COLOR;
            s_buf[ir][jr] = rc;
          }
        }
        else
            jfil=replength;
      }
   }
  }
 }
}
 return;
} /************ END: subroutine MAP_ARTIFICIAL_V() ****************/
/***************************************************************/
/************* START: subroutine MAP_ARTIFICIAL_H() *************/
/***************************************************************/
void map_artificial_H(int ncols_ladar, int nrows_ladar,
        int ncols_recon, int nrows_recon,
        float **pr_mat, float *rr,
        float k_col, float k_row, float kk_col, float kk_row,
        int **art_regions, int **range, int **s_buf,
        int **edge, int replength )
{ int i,j ,ir,jr,ir_cen,jr_cen,ir1,ir2,jr1,jr2;
  int jtemp, ipre, jfil, rc;
  float f1i,f1j, rt[3],rcol[3], rc1[3],rc2[3], stk[3], rng;
  int point1_inside, point2_inside;

/**** Initialize variables ****/
  ir_cen = ncols_recon/2;   /* center of recon photo */
  jr_cen = nrows_recon/2;

/**** For each pixel, ---in small angle approximation  *******/
  /****  compute line-of-sight vector in SENSOR coordinates ****/
  stk[0] = pr_mat[0][0]*k_row;
  stk[1] = pr_mat[1][0]*k_row;
  stk[2] = pr_mat[2][0]*k_row;

for (i=2; i<ncols_ladar-2; i++)   /* scan along col starting at col 2 */
  {
     for(j=2; j<nrows_ladar-2; j++)  /*** start line processing ****/
     { ipre = i-1;                   /* save for next pass*/
       if (edge[i][j] > 0)           /* test for edges*/
       { rt[1] = (i-ncols_ladar/2) * k_col;
         /***** transform line-of-sight to recon photo coordinates *****/
         rcol[0] = pr_mat[0][1] * rt[1] + pr_mat[0][2];
         rcol[1] = pr_mat[1][1] * rt[1] + pr_mat[1][2];
         rcol[2] = pr_mat[2][1] * rt[1] + pr_mat[2][2];

rng = 20 + range[i][j];
         rt[0] = (float)(j-nrows_ladar/2);
         /* mapping x,y,z of first point */
         rc1[0] = rr[0] + rng *( stk[0]*rt[0] + rcol[0] );
         rc1[1] = rr[1] + rng *( stk[1]*rt[0] + rcol[1] );
         rc1[2] = rr[2] + rng *( stk[2]*rt[0] + rcol[2] );

/* map previous pixel*/
         rt[1] = (ipre-ncols_ladar/2) * k_col;
         /***** transform line-of-sight to recon photo coordinates *****/
         rcol[0] = pr_mat[0][1] * rt[1] + pr_mat[0][2];
         rcol[1] = pr_mat[1][1] * rt[1] + pr_mat[1][2];
         rcol[2] = pr_mat[2][1] * rt[1] + pr_mat[2][2];

rng = 20 + range[ipre][j];
         rt[0] = (float)(j-nrows_ladar/2);
         /* mapping x,y,z of second point */
         rc2[0] = rr[0] + rng *( stk[0]*rt[0] + rcol[0] );
         rc2[1] = rr[1] + rng *( stk[1]*rt[0] + rcol[1] );
         rc2[2] = rr[2] + rng *( stk[2]*rt[0] + rcol[2] );
```

```
/************* project onto recon plane ******************/
if( (rc1[2]>0.0) && (rc2[2]>0.0) )
{  /* x,y of points on recon plane */
   ir1 = ir_cen + kk_col * rc1[1]/rc1[2];
   jr1 = jr_cen + kk_row * rc1[0]/rc1[2];
   ir2 = ir_cen + kk_col * rc2[1]/rc2[2];
   jr2 = jr_cen + kk_row * rc2[0]/rc2[2];

point1_inside= ( (0<ir1) && (ir1<ncols_recon) && (0<jr1)
                    && (jr1<nrows_recon) );
   point2_inside= ( (0<ir2) && (ir2<ncols_recon) && (0<jr2)
                    && (jr2<nrows_recon) );

if (point1_inside && point2_inside)
   {  for(jfil=0; jfil<replength; jfil++)
      {  ir = ir1 + ((ir2-ir1)*jfil)/replength;
         jr = jr1 + ((jr2-jr1)*jfil)/replength;
         rc = rc1[2] + ((rc2[2]-rc1[2])*jfil)/replength;
         if ( rc < z_buf[ir][jr] )
         {  art_regions[ir][jr] = ARTIF_COLOR;
            z_buf[ir][jr] = rc;
         }
      }
   }
   else if (point1_inside && (! point2_inside))
   {  for(jfil=0; jfil<replength; jfil++)
      {  ir = ir1 + ((ir2-ir1)*jfil)/replength;
         jr = jr1 + ((jr2-jr1)*jfil)/replength;

if ( (0<ir) && (ir<ncols_recon) && (0<jr)
              && (jr<nrows_recon) )
         {  rc = rc1[2] + ((rc2[2]-rc1[2])*jfil)/replength;
            if ( rc < z_buf[ir][jr] )
            {  art_regions[ir][jr] = ARTIF_COLOR;
               z_buf[ir][jr] = rc;
            }
         }
         else
            jfil=replength;
      }
   }
   else if (point2_inside && (! point1_inside))
   {  for(jfil=0; jfil<replength; jfil++)
      {  ir = ir2 + ((ir1-ir2)*jfil)/replength;
         jr = jr2 + ((jr1-jr2)*jfil)/replength;

if ( (0<ir) && (ir<ncols_recon) && (0<jr)
              && (jr<nrows_recon) )
         {  rc = rc2[2] + ((rc1[2]-rc2[2])*jfil)/replength;
            if ( rc < z_buf[ir][jr] )
            {  art_regions[ir][jr] = ARTIF_COLOR;
               z_buf[ir][jr] = rc;
            }
         }
         else
            jfil=replength;
      }
   }
  }
 }
}
return;
} /************* END: subroutine MAP_ARTIFICIAL_E() ******************/
``` c    Program to correct for LADAR dynamics.

```
     implicit none include 'ipes$include:ipunits.inc'
     include 'ipes$include:ipflag_values.inc'
     include 'ipes$include:ipcontrol.inc' character*80 fname
     integer*4 rslot,islot,azslot,elslot,yawslot,pitslot,rollslot,rw_hdr
     integer*4 xslot,yslot,zslot,nr,nc,i,j,nf,status
     integer*2 az(340,148),el(340,148),pitch(340,148),roll(340,148),yaw(340,148)

include 'lash$include:lash_hdr.inc' do j=1,148
```

```
      do i=1,340
        az(i,j)=i-170
        el(i,j)=j-72
        pitch(i,j)=0
        roll(i,j)=0
        yaw(i,j)=0
      end do
      end do call ipinit write(6,'('' Enter filename to process'')')
      read(5,'(q,a80)',err=1,end=1),nf,fname(1:nf)
c
c     Read header for the file
c
      status=rw_hdr('lash$header:'//fname(1:nf)//'.hdr',hdr,0)

call ipinput ('lash$data:'//fname(1:nf),rslot,,)
      call iplist_ctl (rslot,'input and display',ipprompt)

c     call ipinput ('lash$data:'//fname(1:nf)//'az',azslot,,)
c     call iplist_ctl (azslot,'input and display',ipprompt)

c     call ipinput ('lash$data:'//fname(1:nf)//'el',elslot,,)
c     call iplist_ctl (elslot,'input and display',ipprompt)

c     call ipinput ('lash$data:'//fname(1:nf)//'yaw',yawslot,,)
c     call iplist_ctl (yawslot,'input and display',ipprompt)

c     call ipinput ('lash$data:'//fname(1:nf)//'pitch',pitslot,,)
c     call iplist_ctl (pitslot,'input and display',ipprompt)

c     call ipinput ('lash$data:'//fname(1:nf)//'roll',rollslot,,)
c     call iplist_ctl (rollslot,'input and display',ipprompt)

nr=ipslots(rslot).nrows
      nc=ipslots(rslot).ncols call ipoutput('lash$output:'//fname(1:nf)//'x',iptype_r=4,nr,nc,xslot,)
      call ipoutput('lash$output:'//fname(1:nf)//'y',iptype_r=4,nr,nc,yslot,)
      call ipoutput('lash$output:'//fname(1:nf)//'z',iptype_r=4,nr,nc,zslot,)

c     hdr.info.lpr=laser pulse rate (18.8 khz)
c     hdr.info.clks=laser clocks per nod (188)
c     hdr.info.gsf=gimbal scale factor conversion
c     hdr.info.hsf=humphreys scale factor conversion
c     hdr.info.dep=depression angle of sensor (17.5 degrees)
c     hdr.info.hres=hor res (0.4 mrads)
c     hdr.info.vres=ver res (0.4 mrads)
c     hdr.info.nods=number of nods
c     hdr.info.velocity = velocity vector determined from gps
c     hdr.info.ndetectors = 2 (2 channels)

if(status.eq.4) then
        Type*,'Header file not found - attempting to set intital conditions'
        hdr.info.lpr=18800.0
        hdr.info.clks=188.0
        hdr.info.dep=17.5/57.3
        hdr.info.hres=0.0004
        hdr.info.vres=0.0004
        hdr.info.rres=0.15
        hdr.info.gsf(1)=hdr.info.hres
        hdr.info.gsf(2)=hdr.info.vres
        hdr.info.nods=170
        hdr.info.velocity(1)=60
        hdr.info.velocity(2)=0
        hdr.info.velocity(3)=0
        hdr.info.ndetectors=2
        status=rw_hdr('lash$header:'//fname(1:nf)//'.hdr',hdr,1)
      endif if(hdr.info.ndetectors*hdr.info.nods.ne.ipslots(rslot).ncols) stop 'Error in file size' c     call r2xyz(%val(ipaddresses(rslot).start),%val(ipaddresses(azslot).start),%val(ipaddresses(elslot).start),
c    1 %val(ipaddresses(yawslot).start),%val(ipaddresses(pitslot).start),%val(ipaddresses(rollslot).start),
c    2
```

```
      tval(ipaddresses(xslot).start),tval(ipaddresses(yslot).start),tval(ipaddresses(zslot).star
      t),
     c   3
     nr,hdr.info.hres,hdr.info.vres,hdr.info.rres,hdr.info.gsf,hdr.info.hsf,hdr.info.lpr,hdr.in
     fo.clks,
     c   4  hdr.info.velocity,hdr.info.nods,hdr.info.ndetectors)

call r2xyz(tval(ipaddresses(rslot).start),az,el,yaw,pitch,roll,
          1
     tval(ipaddresses(xslot).start),tval(ipaddresses(yslot).start),tval(ipaddresses(zslot).star
     t),
          2
     nr,hdr.info.hres,hdr.info.vres,hdr.info.rres,hdr.info.gsf,hdr.info.hsf,hdr.info.lpr,hdr.in
     fo.clks,
          3  hdr.info.dep,hdr.info.velocity,hdr.info.nods,hdr.info.ndetectors)

call ipminmax(xslot)
           call ipminmax(yslot)
           call ipminmax(zslot)

call ipcopy_titles(rslot,xslot)
           call ipcopy_titles(rslot,yslot)
           call ipcopy_titles(rslot,zslot)

ipslots(xslot).ntitles=ipslots(xslot).ntitles+1
           write(ipslots(xslot).titles(ipslots(xslot).ntitles),
          1   '('' x = r*(cos(az)*cos(dep)*cos(el)-sin(el)*sin(dep))'')')

ipslots(yslot).ntitles=ipslots(yslot).ntitles+1
           write(ipslots(yslot).titles(ipslots(yslot).ntitles),
          1   '('' y = r*sin(az)*cos(el)'')')
           ipslots(zslot).ntitles=ipslots(zslot).ntitles+1
           write(ipslots(zslot).titles(ipslots(zslot).ntitles),
          1   '('' z = r*(sin(dep)*cos(az)*cos(el)+cos(dep)*sin(el))'')')

1     stop
           end subroutine
     r2xyz(rng,alpha,gamma,psi,theta,phi,x,y,z,nr,hres,vres,rres,gsf,hsf,lpr,lclks,dep,vel,nods
     ,ndetectors)
           implicit none
           integer*4 nr,nods,ndetectors
           integer*2 rng(0:nods*ndetectors-1,0:nr-1)
           real*4
     x(0:nods*ndetectors-1,0:nr-1),y(0:nods*ndetectors-1,0:nr-1),z(0:nods*ndetectors-1,0:nr-1)
           integer*2 alpha(0:nods*ndetectors-1,0:nr-1),gamma(0:nods*ndetectors-1,0:nr-1)
           integer*2
     psi(0:nods*ndetectors-1,0:nr-1),theta(0:nods*ndetectors-1,0:nr-1),phi(0:nods*ndetectors-1,
     0:nr-1)
           real*4 hres,vres,rres,gsf(2),hsf(3),vel(3),dep,lclks,lpr
           real*4
     c_psi,s_psi,c_theta,s_theta,c_phi,s_phi,c_beta,s_beta,c_alpha,s_alpha,c_gamma,s_gamma
           real*4 r,x1,y1,z1,tj,t,t_nod,d2
           integer*4 i,j,k,l,m c_beta=cos(dep)
           s_beta=sin(dep)
           d2=float(ndetectors-1)/2.
           t_nod=lclks/lpr type*,'Number of nods - ',nods
           type*,'Number of detectors - ',ndetectors
           type*,'Laser info - ',lclks,lpr
           type*,'Depression angle - ',dep*57.3
           type*,'Velocity vector - ',vel
           type*,'Angular resolutions - ',hres,vres
           type*,'Range resolution - ',rres
           type*,'Nod frequency - ',t_nod
           pause do j=0,nr-1
           tj=float(j)/lpr
           do i=0,nods-1
           k=i*ndetectors
           do l=0,ndetectors-1
           m=k+l
           c_psi=cos(psi(m,j)*hsf(1))
           s_psi=sin(psi(m,j)*hsf(1))
           c_theta=cos(theta(m,j)*hsf(2))
           s_theta=sin(theta(m,j)*hsf(2))
           c_phi=cos(phi(m,j)*hsf(3))
```

```fortran
      s_phi=sin(phi(m,j)*hsf(3))
      c_alpha=cos(alpha(m,j)*gsf(1)+(1-d2)*hres)
      s_alpha=sin(alpha(m,j)*gsf(1)+(1-d2)*hres)
      c_gamma=cos(gamma(m,j)*gsf(2))
      s_gamma=sin(gamma(m,j)*gsf(2))
      t=i*t_pod+tj r=rng(m,j)*rres
      x1=r*(c_gamma*c_alpha*c_beta-s_gamma*s_beta)
      y1=r*c_gamma*s_alpha
      z1=r*(s_gamma*c_beta+c_gamma*c_alpha*s_beta)
c     x(m,j)=x1*c_theta+(y1*s_phi+z1*c_phi)*c_psi-(y1*c_phi-z1*s_phi)*s_psi+t*vel(1)
c     y(m,j)=x1*c_theta+(y1*s_phi+z1*c_phi)*s_psi+(y1*c_phi-z1*s_phi)*c_psi+t*vel(2)
c     z(m,j)=-x1*s_theta+(y1*s_phi+z1*c_phi)*c_theta+t*vel(3)
      x(m,j)=x1+t*vel(1)
      y(m,j)=y1+t*vel(2)
      z(m,j)=z1+t*vel(3)
      end do
      end do
      end do return
      end
```

```c
#include <stdio.h>
include <stdlib.h>
#include <math.h>
#include <graph.h>

/*****************************************************************/
/*              Subroutine: rrot()                               */
/*                                                               */
/* To generate the rotation matrix for angles yaw, pitch, roll.  */
/* Axies are   y -- vertical, down                               */
/*             x -- horzontal, to the right                      */
/*             z -- horzontal, forward                           */
/*      Rotations are:                                           */
/*          Yaw around y axis from +z toward +x (clockwise from above) */
/*          Pitch around x axis from +z to +y  (downward)        */
/*          Roll around z axis form +x to -y   (counterclockwise)*/
/*                                                               */
/* Donald E. McArthur    April 17, 1992                          */
/*****************************************************************/
void r_rot(yaw, pitch, roll, rot)
        float yaw,pitch,roll;  /* INPUT angles in radians */
        float **rot;           /* OUTPUT rotation matrix  */
{ rot[0][0] = cos(yaw)*cos(roll) +sin(yaw)*sin(pitch)*sin(roll);
  rot[0][1] = cos(yaw)*sin(roll)-sin(yaw)*sin(pitch)*cos(roll);
  rot[0][2] = sin(yaw)*cos(pitch);
  rot[1][0] = -cos(pitch)*sin(roll);
  rot[1][1] = cos(pitch)*cos(roll);
  rot[1][2] = sin(pitch);
  rot[2][0] = -sin(yaw)*cos(roll)+cos(yaw)*sin(pitch)*sin(roll);
  rot[2][1] = -sin(yaw)*sin(roll)-cos(yaw)*sin(pitch)*cos(roll);
  rot[2][2] = cos(yaw)*cos(pitch);
  return;
} /*********** END: subroutine r_rot() *********/

/*****************************************************************/
/* Subroutine for multiplication of the transpose               */
/*    of a 3x3 matrix by a matrix                               */
/*                                                               */
/* Donald E. McArthur,  April 17,1992                            */
/*****************************************************************/
void Mult_Tran_Matrix_3x3(float **mata,float **matb, float **matp )
{ int i,j;
  for (i=0; i<3; i++)
    { for (j=0; j<3; j++)
        { matp[i][j] =  mata[0][i]*matb[0][j] + mata[1][i]*matb[1][j]+
                mata[2][i]*matb[2][j];
        }
    }
} /******* END: Subroutine Mult_Tran_Matrix_3x3  *******/

/*****************************************************************/
/* Subroutine for multiplication of the transpose               */
/*    of a 3x3 matrix by a vector                               */
/*                                                               */
/* Donald E. McArthur,  April 17,1992                            */
/*****************************************************************/
void Mult_Tran_Matrix_3x1(float **mata,float *vec, float *out)
{ int j;
  for (j=0; j<3; j++)
```

```
   { out[j] =   mata[0][j] * vec[0] + mata[1][j] * vec[1] +
         mata[2][j] * vec[2] ;
   }
} /******* END: Subroutine Mult_Tran_Matrix_3x1  *******/

/******************************************************************/
/* Subroutine to initializefor a matrix to                       */
/*      a constant                                                */
/*                                                                */
/* Donald E. McArthur,  April 17,1992                             */
/******************************************************************/
void  Matrix_Init(int nc, int nr, int value, int **out)
{ int j,k;
  for (j=0; j<nc; j++)
  { for(k=0; k<nr; k++)
    { out[j][k] = value;
    }
  }
} /******* END: subroutine _Matrix_Init()  *******/

/******************************************************************/
/* Subroutine for dynamic memory management                       */
/******************************************************************/
void **memory(int nc,int nr,int size)
{ void **ptr;
  int i;
  ptr=(void **)malloc(nc*sizeof(void *));
  for(i=0; i<nc; i++)
     ptr[i]=(void *)malloc(nr*size);
  return ptr;
} /******** END: subroutine **memory()  ************/

/******************************************************************/
/* START: Subroutine IMAGE_OR()                                   */
/* by Bryan Pettitt   May 16, 1992                                */
/******************************************************************/
void  image_OR(int **edge1, int **edge2,
               int ncols, int nrows, int **image_ORed)
{ int col, row;

for (col=0; col < ncols; col++)
   { for (row=0; row < nrows; row++)
     { if (edge1[col][row] != 0)
          image_ORed[col][row] = edge1[col][row];
       else if (edge2[col][row] != 0)
          image_ORed[col][row] = edge2[col][row];
       else
          image_ORed[col][row] = 0;
     }
   }
}

/******************************************************************/
/* START: Subroutine IMAGE_AND()                                  */
/* by Bryan Pettitt   May 16, 1992                                */
/******************************************************************/
void  image_AND(int **edge1, int **edge2,
                int ncols, int nrows, int **image_ANDed)
{ int col, row;

for (col=0; col < ncols; col++)
   { for (row=0; row < nrows; row++)
     { if ( (edge1[col][row] != 0) && (edge2[col][row] != 0) )
          image_ANDed[col][row] = edge1[col][row];
       else
          image_ANDed[col][row] = 0;
     }
   }
} include <graph.h>

/******************************************************************/
/* Subroutine to disply two images on VGA                         */
```

```c
/* The two images are positioned side-by-side on the screen          */
/* Bryan Pettitt  May 28, 1992                                       */
/*******************************************************************/
disp_2images(int ncols1, int nrows1, int **image1, int start1col, int start1row,
             int ncols2, int nrows2, int **image2, int start2col, int start2row,
             int slide_num)
{ register jm,jn1,jn2,jmax,kk;
  int i;
  long red, green, blue, color;
  int n, col, row;
  struct textsettings ts;

_clearscreen ( _GCLEARSCREEN );
  _setvideomode(_VRES256COLOR);    /* initialization of VGA */
  _gettextsettings ( &ts );
  _setcharsize( 15 * ts.height / 10 , 15 * ts.width / 10 );
  _settextalign( _CENTER, _HALF );

/* Remap pallet for 64 grey shades */
  for ( i=0; i < 64; i++)
  {
     red = i;
     green = i << 8;
     blue = i << 16;
     _remappalette( i, red+green+blue);
     _remappalette( i+64, red);
     _remappalette( i+128, green);
     _remappalette( i+192, blue);

_remappalette( 318, red);
     _remappalette( 444, blue);

}

_setcolor(63); /* bright white for title display */
  _setcharsize( 10 * ts.height / 10 , 10 * ts.width / 10 );

/* Decide which title text to display based on slide_num */
  switch( slide_num )
  {  case 1: /* Intensity and Range Ladar Imagery */
         _setcharsize( 15 * ts.height / 10 , 15 * ts.width / 10 );
         _grtext( 345, 70, " LADAR Images " );
         _setcharsize( 10 * ts.height / 10 , 10 * ts.width / 10 );
         _grtext( 130, 110, " Intensity ");
         _grtext( 450, 110, " Range ");
         break;
     case 2: /* Original Intensity and Transformed Image */
         _grtext( 130, 110, " LADAR Intensity ");
         _grtext( 450, 110, " Transformed Image ");
         break;
     case 3: /* Recon Photo and Transformed edges */
         _grtext( 130, 110, " RECCE Photo ");
         _grtext( 450, 110, " Transformed Intensity ");
         break;
     case 4: /* Recon Photo and Transformed edges */
         _grtext( 130, 110, " RECCE Edges ");
         _grtext( 450, 110, " Transformed Edges ");
         break;
     case 5: /* Recon Photo and Transformed edges */
         _grtext( 130, 110, " Edge Image Overlay ");
         _grtext( 450, 110, " Image Match ");
         break;
     default:
         break;
  }
  /* set color by stripping lower 2 bytes, divide to give 64 grey scales */
  for (col=0; col < ncols1; col++)
  {  for(row=0; row < nrows1; row++)
     {
         _setcolor((int) (image1[col][row])/4);
         _setpixel(col+start1col,row+start1row);
     }
  }
  getch();
  for (col=0; col < ncols2; col++)
  {  for(row=0; row < nrows2; row++)
     {
         _setcolor((int) (image2[col][row])/4);
         _setpixel(col+start2col,row+start2row);
     }
  } /* end of col and rowumn loops */
```

```
    _setcolor(63);
    _rectangle( _GBORDER, start1col-1, start1row-1, ncols1+start1col-1,
                nrows1+start1row-1);
    _rectangle( _GBORDER, start2col-1, start2row-1, ncols2+start2col-1,
                nrows2+start2row-1);

getch();
    _setvideomode(_DEFAULTMODE);
    return;
} /*** end of subroutine dispmat_2() ****************************/
/*****************************************************************/ define N 9   /* size of line kernels */
/*****************************************************************/
/* SUBROUTINE: disp_lines()                                      */
/* Bryan Pettitt   June 17, 1992                                 */
/*****************************************************************/
void disp_lines(int **lines, int ncols, int nrows )
{   register jm,jn1,jn2,jmax,kk;
    int i,j;
    long red, green, blue, color;
    int offset = (N-1)/2;   /* kernel center point (array starts at 0) */

_setvideomode(_VRES256COLOR);    /* initialization of VGA */ for (i=offset; i<ncols-offset; i++)  /* moves kernel center */
                                         /* throughout image avoiding edges */
    { for(j=offset; j<nrows-offset; j++)
        { switch( lines[i][j] )
            { case 1:
                _moveto(i-4, j-3);
                _lineto(i+4, j+3);
                break;
            case 2:
                _moveto(i-4, j-4);
                _lineto(i+4, j+4);
                break;
            case 3:
                _moveto(i-3, j-4);
                _lineto(i+3, j+4);
                break;
            case 4:
                _moveto(i-2, j-4);
                _lineto(i+2, j+4);
                break;
            case 5:
                _moveto(i-1, j-4);
                _lineto(i+1, j+4);
                break;
            case 6:
                _moveto(i, j-4);
                _lineto(i, j+4);
                break;
            case 7:
                _moveto(i-4, j+3);
                _lineto(i+4, j-3);
                break;
            case 8:
                _moveto(i-4, j+3);
                _lineto(i+4, j-3);
                break;
            case 9:
                _moveto(i-4, j+1);
                _lineto(i+4, j-1);
                break;
            case 10:
                _moveto(i-4, j);
                _lineto(i+4, j);
                break;
            case 11:
                _moveto(i-4, j-1);
                _lineto(i+4, j+1);
                break;
            case 12:
                _moveto(i-4, j-2);
                _lineto(i+4, j+2);
                break;
            case 13:
                _moveto(i+1, j-4);
                _lineto(i-1, j+4);
                break;
            case 14:
                _moveto(i+2, j-4);
```

```c
                    _lineto(i-2, j+4);
                    break;
                case 15:
                    _moveto(i+3, j-4);
                    _lineto(i-3, j+4);
                    break;
                case 16:
                    _moveto(i+4, j-4);
                    _lineto(i-4, j+4);
                    break;
                default:
                    break;
            }
        }
    }
    getch();
    _setvideomode(_DEFAULTMODE);
    return; } include "mouse1.c"
/***********************************************************************/
/* Subroutine to disply cross-hairs                                    */
/* Written by: Bryan Pettitt   May 18, 1992                            */
/***********************************************************************/
display_crosshairs( int ncols1, int nrows1, int **image1,
                    int ncols2, int nrows2, int **image2,
                    int slide_num,int **ladar_label_y, int **ladar_label_x,
                    int recon_y,int recon_x)

{ register jm,jn1,jn2,jmax,kk;
  int i,j;
  long red, green, blue, color;
  int n, col, row;
  int ladar_x, ladar_y;
  int left_pressed = 0;
  int right_pressed = 0;
  struct textsettings ts;
  char *buf;

_clearscreen ( _GCLEARSCREEN );
  _setvideomode(_VRES256COLOR);     /* initialization of VGA */ if (!init_mouse() )
  {   printf("Mouse initialization error!\n");
      printf("MOUSE.COM or MOUSE.SYS loaded?\n");
      exit(1);
  }

_gettextsettings ( &ts );
  _setcharsize( 15 * ts.height / 10 , 15 * ts.width / 10 );
  _settextalign( _CENTER, _HALF );

/* Remap pallet for 64 grey shades */
  for ( i=0; i < 64; i++)
  {
      red = i;
      green = i << 8;
      blue = i << 16;
      _remappalette( i, red+green+blue);
      _remappalette( 318,  red);
      _remappalette( 444,  blue);
      _remappalette( 555,  green);
  }

_setcolor(63); /* bright white for title display */
  _setcharsize( 10 * ts.height / 10 , 10 * ts.width / 10 );

/* Decide which title text to display based on slide_num */
  switch( slide_num )
  { case 1: /* Intensity and Range Ladar Imagery */
        _setcharsize( 15 * ts.height / 10 , 15 * ts.width / 10 );
        _grtext( 345, 70, " LADAR Images " );
        _setcharsize( 10 * ts.height / 10 , 10 * ts.width / 10 );
        _grtext( 130, 110, " Intensity ");
        _grtext( 450, 110, " Range ");
        break;
    case 2: /* Original Intensity and Transformed Image */
        _grtext( 130, 110, " LADAR Intensity ");
        _grtext( 450, 110, " Transformed Image ");
        break;
    case 3: /* Recon Photo and Transformed edges */
        _grtext( 130, 110, " RECCE Photo ");
```

```c
            _grtext( 450, 110, " Transformed Edges ");
            break;
        case 4: /* Recon Photo and Transformed edges */
            _grtext( 130, 110, " RECCE Edges ");
            _grtext( 450, 110, " Transformed Edges ");
            break;
        case 5: /* Recon Photo and Transformed edges */
            _grtext( 130, 110, " Edge Image Overlay ");
            _grtext( 450, 110, " Image Match ");
            break;
        default:
            break;
    }

/* display first image starting at 0,125 */
    /* and second starting at 345,125      */
    /* set color by stripping lower 2 bytes, divide to give 64 grey scales */
    for (col=0; col < ncols1; col++)
    {   for(row=0; row < nrows1; row++)
        {
            _setcolor((int) (image1[col][row])/4);
            _setpixel(col,row+125);
        }
    }
    for (col=0; col < ncols2; col++)
    {   for(row=0; row < nrows2; row++)
        {
            _setcolor((int) (image2[col][row])/4);
            _setpixel(col+345,row+125);
        }
    } /* end of col and rownum loops */

_rectangle( _GBORDER, 0, 125, ncols1, 125+nrows1);
    _rectangle( _GBORDER, 345, 125, 345+ncols2, 125+nrows2);

buf = malloc( _imagesize(0, 0, 640, 480) );

_getimage( 0, 0, 640, 480, buf ); /* clean image without crosshairs */
    while (!right_pressed )
    {
        mouse_start();
        while (!left_pressed && !right_pressed )
        {
            mouse_display();  /* draw mouse curson on top of current image */
            right_pressed = right_button();
            left_pressed = left_button();  /* check if left button pressed */
            if (left_pressed)
            {
                _putimage(0, 0, buf, _GPSET );
                ladar_y=ladar_label_y[recon_y][recon_x];
                ladar_x=ladar_label_x[recon_y][recon_x]+125;
                recon_y=recon_y+345;
                recon_x=recon_x+125;

for (j= 4; j<28; j++)   /* draw 24 point crosshairs on images */
                {   _setpixel(ladar_y+j, ladar_x );
                    _setpixel(recon_y+j, recon_x );
                    _setpixel(ladar_y-j, ladar_x );
                    _setpixel(recon_y-j, recon_x );
                    _setpixel(ladar_y,   ladar_x );
                    _setpixel(recon_y,   recon_x );
                    _setpixel(ladar_y,   ladar_x+j);
                    _setpixel(recon_y,   recon_x+j);
                    _setpixel(ladar_y,   ladar_x-j);
                    _setpixel(recon_y,   recon_x-j);
                }
                left_pressed = 0;
            }
        }
        mouse_end();
    }

_setvideomode(_DEFAULTMODE);
    return;

} /*** END: Subroutine display_crosshairs() ***/
/*****************************************************************************/
/* Subroutine EDGE_THIN() to thin edges of a binary image                    */
/*     based on Jain Fun. of DIP 1989,  p. 383.                              */
/*  Implemented by: Bryan Pettitt  June 3, 1992                              */
/*****************************************************************************/
```

```
/*                                                                              */
/*    |12|11|10           Algorithm:                                            */
/*    --+--+--+--                                                               */
/*  p13|p3|p2|p9          P1 deleted if       2 <= NZN(p1) <= 6                 */
/*    --+--+--+--                       and        Z0(p1) = 1                   */
/*  p14|p4|P1|p8                        and   p2.p4.p8 = 0  or  Z0(p2) != 1     */
/*    --+--+--+--                       and   p2.p4.p6 = 0  or  Z0(p4) != 1     */
/*  p15|p5|p6|p7          where Z0(p1) is number of non-zero transitions        */
/*                        in the ordered set p2->p3->...->p9->p2                */
/*                        and NZN is number of nonzero neighbors.               */
/********************************************************************************/ define NONZERO  1
define ZERO     0
#define OFF      0
define OR       || edge_thin(int ein, int ncols, int nrows, int eout )
{
    int t23,t34,t45,t56,t67,t78,t89,t92; /* zero->nonzero transition count */
    int t1112,t123,t41,t18,t910,t1011,t1415,t155,t61,t12,t313,t1314;
    int p1,p2,p3,p4,p5,p6,p7,p8,p9,p10,p11,p12,p13,p14,p15; /* pixel values */
    int i,j,x;
    int NUM_NonZeroNeighbors;
    int NUM_P1_ZeroToNonzero;
    int NUM_P2_ZeroToNonzero;
    int NUM_P4_ZeroToNonzero;
    int status = 1;
    int ImageChanged = 1;
    int ImageUnchanged = 0;
    int passcount = 0;
    int **flagged;

flagged = (int **) memory(ncols,nrows,4);
    _Matrix_Init(ncols,nrows,0,flagged);

/* copy original edge image to working output array */
    for (i=3; i < ncols-3; i++)
    { for (j=3; j < nrows-3; j++)
        eout[i][j] = ein[i][j];
    } printf("Please wait...thinning edges...\n");

while (status == ImageChanged)
    {
        status = ImageUnchanged;
        for (i=3; i <= ncols-3; i++)
        { for (j=3; j <= nrows-3; j++)
            {
                NUM_NonZeroNeighbors = 0;
                if(p1 = eout[i][j] != 0) /* don't need to delete (thin) */
                                         /* a zero valued point */
                { p2 = eout[i-1][j];
                  p3 = eout[i-1][j-1];
                  p4 = eout[i][j-1];
                  p5 = eout[i+1][j-1];
                  p6 = eout[i+1][j];
                  p7 = eout[i+1][j+1];
                  p8 = eout[i][j+1];
                  p9 = eout[i-1][j+1];
                  p10= eout[i-2][j+1];
                  p11= eout[i-2][j];
                  p12= eout[i-2][j-1];
                  p13= eout[i-1][j-2];
                  p14= eout[i][j-2];
                  p15= eout[i+1][j-2];
                  if (p2 > ZERO)  NUM_NonZeroNeighbors++;
                  if (p3 > ZERO)  NUM_NonZeroNeighbors++;
                  if (p4 > ZERO)  NUM_NonZeroNeighbors++;
                  if (p5 > ZERO)  NUM_NonZeroNeighbors++;
                  if (p6 > ZERO)  NUM_NonZeroNeighbors++;
                  if (p7 > ZERO)  NUM_NonZeroNeighbors++;
                  if (p8 > ZERO)  NUM_NonZeroNeighbors++;
                  if (p9 > ZERO)  NUM_NonZeroNeighbors++;

t23=t34=t45=t56=t67=t78=t89=t92 = 0;
                  t1112=t123=t41=t18=t910=t1011=t1415=t155=t61=t12=t313=t1314=0;
                  NUM_P1_ZeroToNonzero = 0;
                  NUM_P2_ZeroToNonzero = 0;
                  NUM_P4_ZeroToNonzero = 0;

/* continue thinning if 2 <= NUM_NonZeroNeighbors <= 6 */
                  if (2 <= NUM_NonZeroNeighbors && NUM_NonZeroNeighbors <= 6)
```

```
        { if ((p2 == ZERO) && (p3 != ZERO))  t23  = 1;
          if ((p3 == ZERO) && (p4 != ZERO))  t34  = 1;
          if ((p4 == ZERO) && (p5 != ZERO))  t45  = 1;
          if ((p5 == ZERO) && (p6 != ZERO))  t56  = 1;
          if ((p6 == ZERO) && (p7 != ZERO))  t67  = 1;
          if ((p7 == ZERO) && (p8 != ZERO))  t78  = 1;
          if ((p8 == ZERO) && (p9 != ZERO))  t89  = 1;
          if ((p9 == ZERO) && (p2 != ZERO))  t92  = 1;
          if ((p11== ZERO) && (p12!= ZERO))  t1112= 1;
          if ((p12== ZERO) && (p3 != ZERO))  t123 = 1;
          if ((p4 == ZERO) && (p1 != ZERO))  t41  = 1;
          if ((p1 == ZERO) && (p8 != ZERO))  t18  = 1;
          if ((p9 == ZERO) && (p10!= ZERO))  t910 = 1;
          if ((p10== ZERO) && (p11!= ZERO))  t1011= 1;
          if ((p14== ZERO) && (p15!= ZERO))  t1415= 1;
          if ((p15== ZERO) && (p5 != ZERO))  t155 = 1;
          if ((p6 == ZERO) && (p1 != ZERO))  t61  = 1;
          if ((p1 == ZERO) && (p2 != ZERO))  t12  = 1;
          if ((p3 == ZERO) && (p13!= ZERO))  t313 = 1;
          if ((p13== ZERO) && (p14!= ZERO))  t1314= 1;

NUM_P1_ZeroToNonzero =t23+t34+t45+t56+t67+t78+t89+t92;
          NUM_P2_ZeroToNonzero =t1112+t123+t34+t41+t18+t89+t910+t1011;
          NUM_P4_ZeroToNonzero =t1415+t155+t56+t61+t12+t23+t313+t1314;

if (NUM_P1_ZeroToNonzero == 1)  /* continue thinning */
          { if ((p2&&p4&&p8 == 0) OR (NUM_P2_ZeroToNonzero != 1) )
             { if ( (p2&&p4&&p6 == 0) OR (NUM_P4_ZeroToNonzero != 1))
                { status = ImageChanged;
                  flagged[i][j] = 1;
                }
             }
          }
       }
     }/* end if p1 != 0 */
   }
 } /* end col/row loop */ for (i=3; i <= ncols-3; i++)
 { for (j=3; j <= nrows-3; j++)
   { if (flagged[i][j] == 1)
        aout[i][j]=0;
   }
 }
 _Matrix_Init(ncols,nrows,0,flagged);

} /* end while ImageChananged loop */
}
/****************************************************************/
/*                                                              */
/*              SUBROUTINE: edggrad3                            */
/*                                                              */
/* Purpose: This subroutine applies four gradient masks to an input */
/*          array and a number of ways exist for determining the */
/*          magnitude which is taken as the gradient at that point */
/*          in the input array (or image).  The direction of the */
/*          gradient is determined by teh particular mask that  */
/*          yields the largest magnitude and by the sign of the */
/*          applied mask.  There are a total of 8 directions    */
/*          45 degrees apart.                                   */
/*                                                              */
/****************************************************************/
/*                                                              */
/*   Notes: The gradient masks are as follows:                  */
/*                                                              */
/*   work[3]=-1  0   1    work[2]= 0   1   1                    */
/*          -1   0   1            -1   0   1                    */
/*          -1   0   1            -1  -1   0                    */
/*          (0 deg)               (45 deg)                      */
/*                                                              */
/*   work[1]= 1  1   1    work[4]= 1   1   0                    */
/*           0   0   0             1   0  -1                    */
/*          -1  -1  -1             0  -1  -1                    */
/*          (90 deg)              (135 deg)                     */
/*                                                              */
/****************************************************************/
/*                                                              */
/*   Converted from FORTRAN code for WATCOM C                   */
/*                                                              */
/*     FORTRAN code by: Walter N. Delashmit   1 September 1983  */
/*     C conversion by: Bryan Pettitt         13 May 1992       */
/*                                                              */
/****************************************************************/
```

```c
/*    Modification history:                                              */
/*         9-7-83 - to combine components differently                    */
/*                                                                       */
/*************************************************************************/
#include <stdio.h>
#include <math.h>
include <stdlib.h> define EDGE_COLOR  318 void edggrad3(int image, int grad_mag,
              int ncols,int nrows, int imag, int div,int threshold)
{ int x,y,l,sign,smallest,largest,m,k,n;
  int tmp1,tmp2,xtmp1,xtmp2,xtmp;
  int work[5],work1,work2,work3,work4;

printf("Please wait...finding edges\n");

/* Initialize work variables */
  for (x=1; x<=4; x++)
     work[x]=0;
  largest=1;
  smallest=13000;

/* Apply gradient masks to image */
  for (y=2; y<ncols; y++)
  { for (x=2; x<nrows; x++)
    { work[1]=image[y-1][x-1]+image[y-1][x]+image[y-1][x+1]
             -(image[y+1][x-1]+image[y+1][x]+image[y+1][x+1]);
      work1=work[1];
      work[2]=-(image[y-1][x]+image[y-1][x+1]+image[y][x+1])
              +image[y][x-1]+image[y+1][x-1]+image[y+1][x];
      work2=abs(work[2]);
      work[3]=image[y-1][x+1]+image[y][x+1]+image[y+1][x+1]
             -(image[y-1][x-1]+image[y][x-1]+image[y+1][x-1]);
      work3=work[3];
      work[4]=image[y-1][x]+image[y-1][x-1]+image[y][x-1]
             -(image[y][x+1]+image[y+1][x+1]+image[y+1][x]);
      work4=work[4];
      m=abs(work1);
      k=1;
      /* Determine the largest gradient from above masks */
      for (l=2; l<=4; l++)
      { if (m < abs(work[l]))
        { k=l;
          m=abs(work[l]);
        }
      }
      if (imag==1)
      { grad_mag[y][x]=m;
/*      printf("largest mask is\t%d with value\t%d\n",k,m);
        printf("%d\t%d\t%d\n%d\t%d\t%d\n%d\t%d\t%d\n\n",
               image[y-1][x-1],image[y-1][x],image[y-1][x+1],
               image[y][x-1],image[y][x],image[y][x+1],
               image[y+1][x-1],image[y+1][x],image[y+1][x+1]); */
      }
      if (imag==2)
      { xtmp=(abs(work1)+abs(work2)+abs(work3)+abs(work4))/div;
        grad_mag[y][x]=xtmp;
      }
      if (imag==3)
      { xtmp=work1*work1+work2*work2+work3*work3+work4*work4;
        grad_mag[y][x]=sqrt(xtmp/div);
      }
      if (imag==4)
      { xtmp1=sqrt(work1*work1+work3*work3)/div;
        xtmp2=sqrt(work2*work2+work4*work4)/div;
        grad_mag[y][x]=max(xtmp1,xtmp2);
      }
      /* n will be equal to the largest magnitude in grad_mag */
      if (m > largest)
         largest=abs(m);
      /* determine direction of gradient (range is 0-7) */
      if (work[k]>0)
         sign=1;
      else
         sign=-1;
      grad_dir[y][x]=k-1+(sign)-1*(-2);
    }
  }
  /* Create binary edge image */
  for (y=2; y<ncols; y++)
```

```
{ for (x=2; x<nrows; x++)
   { if (grad_mag[y][x] >= threshold)
        grad_mag[y][x]=EDGE_COLOR;
     else
        grad_mag[y][x]=0;
   }
}
return;}
/*****************************************************************/
/* SUBROUTINE: gapfill();                                        */
/*      performs gap filling on transformed ladar image          */
/* Written by: Bryan Pettitt June 9, 1992                        */
/*****************************************************************/
gapfill(int **image, int ncols, int nrows )
{  int col,row, **temp;
   int p4,p3,p2,p1,n1,n2,n3,n4;
   int div = 0;

temp = (int **) memory(ncols, nrows, 4);
   _Matrix_Init(ncols,nrows,0,temp);

printf("Please wait...filling gaps...\n");

/* start at bottom of image and if current point is zero     */
   /* average two previous and next two pixels along a column   */
   /* as the filled in pixel value.                             */
   for(col=0; col<ncols; col++)
   { for(row=nrows-4; row>4; row--)
     {
        if ( (p3=image[col][row-3]) != 0 ) div ++;
        if ( (p2=image[col][row-2]) != 0 ) div ++;
        if ( (p1=image[col][row-1]) != 0 ) div ++;
        if ( (n1=image[col][row+1]) != 0 ) div ++;
        if ( (n2=image[col][row+2]) != 0 ) div ++;
        if ( (n3=image[col][row+3]) != 0 ) div ++;

/* if some of the points above or below the current point */
        /* are non-zero and the current point is zero, average    */
        /* together the points above and below as the new current point. */
        if ( (div != 0) && (image[col][row] == 0) )
            temp[col][row] = (p3+p2+p1+n1+n2+n3)/div;
        else
            temp[col][row] = image[col][row];

div = 0;
     }
   } for(col=0; col<ncols; col++)
   { for(row=nrows-4; row>4; row--)
     { image[col][row] = temp[col][row];
     }
   }

_Matrix_Init(ncols,nrows,0,temp);
   div = 0;

/* start at bottom of image and if current point is zero     */
   /* average two previous and next two pixels along a row      */
   /* as the filled in pixel value.                             */
   for(col=4; col<ncols-4; col++)
   { for(row=nrows; row>=0; row--)
     {
        if ( (p3=image[col-3][row]) != 0 ) div ++; /* div = # non-zero */
        if ( (p2=image[col-2][row]) != 0 ) div ++;
        if ( (p1=image[col-1][row]) != 0 ) div ++;
        if ( (n1=image[col+1][row]) != 0 ) div ++;
        if ( (n2=image[col+2][row]) != 0 ) div ++;
        if ( (n3=image[col+3][row]) != 0 ) div ++;

/* if some of the points to left or right of the current point */
        /* are != zero and the current point is zero, average          */
        /* together the points to the left and right for current point. */
        if ( (div != 0) && (image[col][row] == 0) )
            temp[col][row] = (p3+p2+p1+n1+n2+n3)/div;
        else
            temp[col][row] = image[col][row];

div = 0;
     }
   } for(col=4; col<ncols-4; col++)
   { for(row=nrows; row>=0; row--)
     { image[col][row] = temp[col][row];
```

```
            }
        }
        return;

} /** END Subroutine gapfill() **/ include <stdio.h>
/**********************************************************/
/* SUBROUTINE: read_image()                               */
/* Bryan Pettitt  May 20, 1992                            */
/**********************************************************/
void read_image(char *filename,int ncols,int nrows,int **image, int size)
{   FILE *fp1;
    int col,row;

printf("Reading File:   %s\n", filename);

if ((fp1 = fopen(filename,"rb")) == NULL)
    {   printf("Cannot open %s for reading.\n",filename);
        return;
    } for (row=0; row < nrows; row++)
    {   for (col=0; col < ncols; col++)
        {   fread(&image[col][row], size, 1, fp1);
        }
    } fclose(fp1);
    return;
} /************ END: subroutine read_image() ***************/

/**********************************************************/
/* SUBROUTINE: write_image()                              */
/* Bryan Pettitt  May 18, 1992                            */
/**********************************************************/
write_image(int **image, int ncols, int nrows, int size, char *filename)
{   FILE *fp1;
    int j;
    int col,row;

printf("Writing File:   %s\n",filename);
    if ((fp1 = fopen(filename,"wb")) == NULL)
    {   printf("Cannot open %s for writing.\n",filename);
        return;
    }

/* write out Fortran ordered image */
    for (row=0; row < nrows; row++)
    {   for (col=0; col < ncols; col++)
            fwrite(&image[col][row], size, 1, fp1);
    } fclose(fp1);
    return;
} /**** END: Subroutine write_image() ****/

/**********************************************************/
/* START: Subroutine ELIMINATE_WATER()                    */
/* Written by: Bryan Pettitt June 28, 1992                */
/**********************************************************/
void eliminate_water(int **inten, int **range, int ncols_ladar, int nrows_ladar)
{   int col, row;

for (col=0; col < ncols_ladar; col++)
    {   for (row=0; row < nrows_ladar; row++)
        {   if (range[col][row] > 12000) /* water detected */
            {   range[col][row] = 0;
                inten[col][row] = 0;
            }
        }
    }
    return;
}
```

```
/*****************************************************************/
/* SUBROUTINE: find_lines()                                      */
/* Bryan Pettitt  June 17, 1992                                  */
/*****************************************************************/ define N 9  /* size of line kernels (NxN kernel)              */
define M 7  /* if M of N edge_image and Kernel points correspond => line */ void find_lines(int edges, int ncols, int nrows, int lines )
{
    int nmasks = 16;        /* number of line masks used in line.h */
    int offset = (N-1)/2;   /* kernel center point (array starts at 0) */
    int count1=0;int count2=0;int count3=0;int count4=0;int count5=0;
    int count6=0;int count7=0;int count8=0;int count9=0;int count10=0;
    int count11=0;int count12=0;int count13=0;
    int count14=0;int count15=0;int count16=0;
    int kernel=0;
    int i,j,m,n;
    int numlines = 0;

printf("Please wait...finding lines...\n");
    for (i=0; i<ncols; i++)      /* make binary edge range from 0->1 */
    { for(j=0; j<nrows; j++)
        { if (edges[i][j] > 0)
            edges[i][j] = 1;
        }
    } for (i=offset; i<ncols-offset; i++)   /* moves kernel center throughout */
    { for(j=offset; j<nrows-offset; j++)  /* image avoiding edges           */
        {
            /* perform line search using 16 kernels each with 9 points line */
            count1 =   edges[i-4][j-3] + edges[i-3][j-2] + edges[i-2][j-2]
                     + edges[i-1][j-1] + edges[i][j]     + edges[i+1][j+1]
                     + edges[i+2][j+2] + edges[i+3][j+2] + edges[i+4][j+3];
            if (count1>M)  kernel=1;
            count2 =   edges[i-4][j-4] + edges[i-3][j-3] + edges[i-2][j-2]
                     + edges[i-1][j-1] + edges[i][j]     + edges[i+1][j+1]
                     + edges[i+2][j+3] + edges[i+3][j+3] + edges[i+4][j+4];
            if (count2>M)  kernel=2;
            count3 =   edges[i-3][j-4] + edges[i-2][j-3] + edges[i-2][j-2]
                     + edges[i-1][j-1] + edges[i][j]     + edges[i+1][j+1]
                     + edges[i+2][j+2] + edges[i+2][j+3] + edges[i+3][j+4];
            if (count3>M)  kernel=3;
            count4 =   edges[i-2][j-4] + edges[i-2][j-3] + edges[i-1][j-2]
                     + edges[i-1][j-1] + edges[i][j]     + edges[i+1][j+1]
                     + edges[i+1][j+2] + edges[i+2][j+3] + edges[i+2][j+4];
            if (count4>M)  kernel=4;
            count5 =   edges[i-1][j-4] + edges[i-1][j-3] + edges[i-1][j-2]
                     + edges[i][j-1]   + edges[i][j]     + edges[i][j+1]
                     + edges[i+1][j+2] + edges[i+1][j+3] + edges[i+1][j+4];
            if (count5>M)  kernel=5;
            count6 =   edges[i][j-4]   + edges[i][j-3]   + edges[i][j-2]
                     + edges[i][j-1]   + edges[i][j]     + edges[i][j+1]
                     + edges[i][j+2]   + edges[i][j+3]   + edges[i][j+4];
            if (count6>M)  kernel=6;
            count7 =   edges[i-4][j+3] + edges[i-3][j+2] + edges[i-2][j+2]
                     + edges[i-1][j+1] + edges[i][j]     + edges[i+1][j-1]
                     + edges[i+2][j-2] + edges[i+3][j-2] + edges[i+4][j-3];
            if (count7>M)  kernel=7;
            count8 =   edges[i-4][j+2] + edges[i-3][j+2] + edges[i-2][j+1]
                     + edges[i-1][j+1] + edges[i][j]     + edges[i+1][j-1]
                     + edges[i+2][j-1] + edges[i+3][j-2] + edges[i+4][j-2];
            if (count8>M)  kernel=8;
            count9 =   edges[i-4][j+1] + edges[i-3][j+1] + edges[i-2][j+1]
                     + edges[i-1][j]   + edges[i][j]     + edges[i+1][j]
                     + edges[i+2][j-1] + edges[i+3][j-1] + edges[i+4][j-1];
            if (count9>M)  kernel=10;
            count10 =  edges[i-4][j]   + edges[i-3][j]   + edges[i-2][j]
                     + edges[i-1][j]   + edges[i][j]     + edges[i+1][j]
                     + edges[i+2][j]   + edges[i+3][j]   + edges[i+4][j];
            if (count10>M) kernel=10;
            count11 =  edges[i-4][j-1] + edges[i-3][j-1] + edges[i-2][j-1]
                     + edges[i-1][j]   + edges[i][j]     + edges[i+1][j]
                     + edges[i+2][j+1] + edges[i+3][j+1] + edges[i+4][j+1];
            if (count11>M) kernel=11;
            count12 =  edges[i-4][j-2] + edges[i-3][j-2] + edges[i-2][j-1]
                     + edges[i-1][j-1] + edges[i][j]     + edges[i+1][j+1]
                     + edges[i+2][j+1] + edges[i+3][j+2] + edges[i+4][j+2];
            if (count12>M) kernel=12;
            count13 =  edges[i+1][j-4] + edges[i+1][j-3] + edges[i+1][j-2]
                     + edges[i][j-1]   + edges[i][j]     + edges[i][j+1]
                     + edges[i-1][j+2] + edges[i-1][j+3] + edges[i-1][j+4];
```

```
        if (count13>M)  kernel=13;
        count14 = edges[i+2][j-4] + edges[i+2][j-3] + edges[i+1][j-2]
                + edges[i+1][j-1] + edges[i][j]   + edges[i-1][j+1]
                + edges[i-1][j+2] + edges[i-2][j+3] + edges[i-2][j+4];
        if (count14>M)  kernel=14;
        count15 = edges[i+3][j-4] + edges[i+2][j-3] + edges[i+2][j-2]
                + edges[i+1][j-1] + edges[i][j]   + edges[i-1][j+1]
                + edges[i-2][j+2] + edges[i-2][j+3] + edges[i-3][j+4];
        if (count15>M)  kernel=15;
        count16 = edges[i+4][j-4] + edges[i+3][j-3] + edges[i+2][j-2]
                + edges[i+1][j-1] + edges[i][j]   + edges[i-1][j+1]
                + edges[i-2][j+2] + edges[i-3][j+3] + edges[i-4][j+4];
        if (count16>M)  kernel=16;

if (kernel > 0)
        {
            lines[i][j] = kernel; /* store kernel number in lines array  */
                                  /* at point i,j where kernel number   */
                                  /* corresponds to 1-16 line orientation */
            numlines++;
        }
        else
            lines[i][j] = 0;

count1=0; count2=0; count3=0; count4=0; count5=0;
        count6=0; count7=0; count8=0; count9=0; count10=0;
        count11=0; count12=0; count13=0; count14=0; count15=0; count16=0;
        kernel = 0;
      }
    }
    printf("%d lines detected\n",numlines);
    return;
}

/*************************************************************************/
/* SUBROUTINE: median();                                                 */
/*       performs median filtering on an image                           */
/* written by: Bryan Pettitt  June 1, 1992                               */
/*************************************************************************/
median(int **image, int ncols, int nrows )
{ int i,j,k,l,temp;
  static int filter[9];

printf("Please wait...median filtering...\n");

for(i=1; i<ncols-1; i++)
    { for(j=1; j<nrows-1; j++)
      {
        filter[0] = image[i-1][j-1];
        filter[1] = image[i-1][j];
        filter[2] = image[i-1][j+1];
        filter[3] = image[i][j-1];
        filter[4] = image[i][j];
        filter[5] = image[i][j+1];
        filter[6] = image[i+1][j-1];
        filter[7] = image[i+1][j];
        filter[8] = image[i+1][j+1];

for(k=0; k<8; k++)
        { for(l=k+1; l<9; l++)
          if( filter[k] < filter[l] )
          { temp = filter[k];
            filter[k] = filter[l];
            filter[l] = temp;
          }
        }
        image[i][j] = filter[4];  /* median value now in filter[4] */
      }
    }
} /**** END Subroutine median() ****/

/*************************************************************************/
/* MOUSE subroutines                                                     */
/*************************************************************************/
#include <dos.h>
#include <malloc.h>
```

```c
int left_button(void);
int right_button(void);
void mouse_display(void);
int init_mouse(void);
void mouse_start(void);
void mouse_end(void);

/* WID   #define X_WIDTH 1024
define Y_HEIGHT 768                          WID  */ define X_WIDTH 640
define Y_HEIGHT 480 char            *mouse_buf;
unsigned char   first_byte;
long            vector;
long            sticks, eticks;
union REGS      iReg,oReg;
union REGS      iZoom,oZoom;
struct SREGS    segregs;
int             cursor_x,cursor_y;

void (interrupt far *int_handler)();

/* What does the mouse pointer look like? */ int          mouse_size  = 17;
int          mouse_size2 = 8;

int  mouse[17][17] = {  0, 0, 0, 0, 0, 0,63, 0, 0, 0,63, 0, 0, 0, 0, 0, 0,
                        0, 0, 0, 0, 0, 0,63, 0, 0, 0,63, 0, 0, 0, 0, 0, 0,
                        0, 0, 0, 0, 0, 0,63, 0, 0, 0,63, 0, 0, 0, 0, 0, 0,
                        0, 0, 0, 0, 0, 0,63, 0, 0, 0,63, 0, 0, 0, 0, 0, 0,
                        0, 0, 0, 0, 0, 0,63, 0, 0, 0,63, 0, 0, 0, 0, 0, 0,
                        0, 0, 0, 0, 0, 0,63, 0, 0, 0,63, 0, 0, 0, 0, 0, 0,
                       63,63,63,63,63,63,63, 0, 0, 0,63,63,63,63,63,63,63,
                        0, 0, 0, 0, 0, 0, 0, 0, 0, 0, 0, 0, 0, 0, 0, 0, 0,
                        0, 0, 0, 0, 0, 0, 0, 0, 0, 0, 0, 0, 0, 0, 0, 0, 0,
                        0, 0, 0, 0, 0, 0, 0, 0, 0, 0, 0, 0, 0, 0, 0, 0, 0,
                       63,63,63,63,63,63,63, 0, 0, 0,63,63,63,63,63,63,63,
                        0, 0, 0, 0, 0, 0,63, 0, 0, 0,63, 0, 0, 0, 0, 0, 0,
                        0, 0, 0, 0, 0, 0,63, 0, 0, 0,63, 0, 0, 0, 0, 0, 0,
                        0, 0, 0, 0, 0, 0,63, 0, 0, 0,63, 0, 0, 0, 0, 0, 0,
                        0, 0, 0, 0, 0, 0,63, 0, 0, 0,63, 0, 0, 0, 0, 0, 0,
                        0, 0, 0, 0, 0, 0,63, 0, 0, 0,63, 0, 0, 0, 0, 0, 0,
                        0, 0, 0, 0, 0, 0,63, 0, 0, 0,63, 0, 0, 0, 0, 0, 0 };

/******************************************************************
Mouse Routines
******************************************************************/ int left_button(void)
{
        iZoom.w.ax = 3;                         /* Get mouse button info */
        int386(0x33, &iZoom, &oZoom);
        if( oZoom.w.bx & 0x01 )
            return(1);                          /* left mouse button pressed */
        else
            return(0);                          /* left mouse button NOT pressed */
} int right_button(void)
{
        iZoom.w.ax = 3;                         /* Get mouse button info */
        int386(0x33, &iZoom, &oZoom);
        if( oZoom.w.bx & 0x02)
            return(1);                          /* right mouse button pressed */
        else
            return(0);                          /* right mouse button NOT pressed */
} void mouse_display(void)
{
        int    x_off,y_off;

iReg.w.ax = 11;                         /* Read mickey counter */
        int386(0x33, &iReg, &oReg);
        if (oReg.w.cx != 0 || oReg.w.dx != 0)   /* Mouse has moved */
        {
```

```c
        _putimage( cursor_x-mouse_size2, cursor_y-mouse_size2,
                   mouse_buf, _GXOR );

if( oReg.w.cx > 32768 )          /* Compute X movement */
           x_off = oReg.w.cx - 65536;
        else
           x_off = oReg.w.cx;
        cursor_x=cursor_x+x_off;
        if (cursor_x < 1) cursor_x=1;
        if (cursor_x > X_WIDTH-1) cursor_x = X_WIDTH-1;

if( oReg.w.dx > 32768 )          /* Compute Y movement */
           y_off = oReg.w.dx - 65536;
        else
           y_off = oReg.w.dx;
        cursor_y=cursor_y+y_off;
        if (cursor_y < 1) cursor_y=1;
        if (cursor_y > Y_HEIGHT-1) cursor_y = Y_HEIGHT-1;

_putimage( cursor_x-mouse_size2, cursor_y-mouse_size2,
                   mouse_buf, _GXOR );

}
} int init_mouse(void)
{
    int    i,j,x,y,old_col;

old_col = _getcolor();

cursor_x = X_WIDTH/2;
    cursor_y = Y_HEIGHT/2;

int_handler = _dos_getvect(0x33);   /* Get mouse interrupt vector */
    first_byte = *(unsigned char far *) int_handler;
    vector = (long) int_handler;
    if ((vector == 0) || (first_byte == 0xcf))
        return(0);              /* Return error if 1st byte is IRET or 0 */
    iReg.w.ax = 0;
    int386(0x33, &iReg, &oReg);             /* Mouse reset and status */
    if( !(oReg.w.ax == -1) )                /* Was mouse found? */
        return(0);                          /* If NOT, return true */ mouse_buf = malloc( _imagesize( 1, 1, mouse_size, mouse_size ) );
    for(i=0; i<mouse_size; i++)
        for(j=0; j<mouse_size; j++)
        {
            x = cursor_x + i - mouse_size2;
            y = cursor_y + j - mouse_size2;
            _setcolor( mouse[i][j] );
            _setpixel( x, y );
        }
    _getimage( cursor_x-mouse_size2, cursor_y-mouse_size2,
               cursor_x+mouse_size2, cursor_y+mouse_size2, mouse_buf );

iReg.w.ax = 11;
    int386(0x33, &iReg, &oReg);             /* Reset mouse */

_setcolor(old_col);

_clearscreen( _GCLEARSCREEN );

return(1);

} void mouse_start(void)
{
    _putimage( cursor_x-mouse_size2, cursor_y-mouse_size2,
               mouse_buf, _GXOR );
} void mouse_end(void)
{
    _putimage( cursor_x-mouse_size2, cursor_y-mouse_size2,
               mouse_buf, _GXOR );
} include <stdio.h>
include <stdlib.h>
#include <math.h>
```

```
/****************************************************************/
/* subsample() - this subroutine subsamples an image            */
/****************************************************************/
void subsample(int **image,int ncols, int nrows,
               int new_ncols, int new_nrows, int **imageout)
{
    int col,row;
    int co, ro;
    float col_step, row_step,c,r;

col_step = (float) ncols / new_ncols;
    row_step = (float) nrows / new_nrows;

c=0.0;
    r=0.0;
    co=0;
    ro=0;

/* copies original image into new image array by skipping pixels */
    for (row=0; row < nrows; row=ceil(r) )
    { for(col=0; col < ncols; col=ceil(c) )
        { c += col_step;
          imageout[co][ro]=image[col][row];
          co++;
        }
        co = 0;
        c = 0.0;
        r += row_step;
        ro++;
    } return;
} /** END: Subroutine write_sub_image() **/
```

```
0           LADAR_Pitch_Degrees
0           LADAR_Yaw_Degrees
0           LADAR_Roll_Degrees
90          Recon_Pitch_Degrees
0           Recon_Yaw_Degrees
0           Recon_Roll_Degrees0
2500        LADAR_y(up_and_down)
0           LADAR_x(left_to_right)
1700        LADAR_z(distance_away)
340         LADAR_ncols
148         LADAR_nrows
295         Recon_ncols
415         Recon_nrows
.5          Map_Visible_Overscan_Stepsize(1=none,.25=4:1)
100         Map_Artificial_Line_Fill_Replication
100         Intensity_Edge_Threshold
200         Range_Edge_Threshold
127         Crosshairs_x
90          Crosshairs_y
f21p5if.img    Intensity_Image
f21p5rf.img    Range_Image
ship1ros.img   Original_Recon_Image
```

Alabama side to top down view conversion parameter data file read in by main.

```
        SUBROUTINE PROCEDUR2(IA,IB,IC,ID,NR,NC,ISR,ISC,ISIZE,IX1,IY1,
        1IX2,IY2,INDEX)
        INTEGER*2 NR,NC
        INTEGER*2 IA(NC,NR),IB(NC,NR),IC(NC,NR),ID(NC,NR)
        INTEGER*2 IX1(1),IY1(1),IX2(1),IY2(1),INDEX
C       PERFORM GRADIENT OPERATION ON IMAGE
        CALL EDGGRAD(IA,IB,ID,NR,NC)
        CALL IMGTGR(IB,ISR-NR-10,ISC,NR,NC,ISIZE)
C       CALL DOCUMENT(IB,NR,NC)
C       DELETE SMALL VALUES
        CALL LEVCHG(IB,IA,NR,NC,ISR-NR-10,ISC,ISIZE)
        CALL IMGTXF(IA,IB,NR,NC)
C       CLUSTER THE LINES FROM THE GRADIENT IMAGE
        CALL LNCLSTR1(IB,ID,IA,IC,NR,NC,256)
        CALL IMGTGR(IA,ISR-NR-10,ISC+NC+10,NR,NC,ISIZE)
C       CALL DOCUMENT(IA,NR,NC)
C       TRANSFORM CLUSTERED IMAGE INTO A BINARY IMAGE
        CALL BINIT(IA,IB,NR,NC,ISR-NR-10,ISC+2*NC+20,ISIZE)
C       IMPLEMENT THINFILL ALGORITHM
```

```
        CALL IMGTXF(IB,IA,NR,NC)
1       CALL THINFILL(IB,ID,NR,NC)
        CALL IMGTGR(ID,ISR-2*NR-20,ISC,NR,NC,ISIZE)
C       CALL DOCUMENT(ID,NR,NC)
        CALL IMGTXF(ID,IB,NR,NC)
        TYPE*,'ENTER 1 TO THINFILL AGAIN'
        ACCEPT*,IGO
        IF(IGO.EQ.1)GO TO 1
C       IMPLEMENT THIN ALGORITHM
2       CALL THINLN(ID,IA,NR,NC)
        CALL IMGTGR(IA,ISR-2*NR-20,ISC,NR,NC,ISIZE)
C       CALL DOCUMENT(IA,NR,NC)
        CALL IMGTXF(IA,ID,NR,NC)
        TYPE*,'ENTER 1 TO THIN AGAIN'
        ACCEPT*,IGO
        IF(IGO.EQ.1)GO TO 2
C       PERFORM MERGE-SLIT ALGORITHM
        CALL IMGTXF(ID,IB,NR,NC)
3       CALL MERGESLIT(ID,IA,NR,NC,IX1,IY1,IX2,IY2,INDEX)
        CALL IMGTGR(IA,ISR-2*NR-20,ISC+2*NC+20,NR,NC,ISIZE)
C       CALL DOCUMENT(IA,NR,NC)
        TYPE*,'ENTER 1 TO WRITE DATA TO LU 9'
        ACCEPT*,IGO
        IF(IGO.NE.1)GO TO 11
        WRITE(9)INDEX
        DO 12 I=1,INDEX
        WRITE(9)IX1(I),IY1(I),IX2(I),IY2(I)
12      CONTINUE
11      CALL IMGTXF(IB,ID,NR,NC)
        TYPE*,'ENTER 1 TO MERGESLIT AGAIN'
        ACCEPT*,IGO
        IF(IGO.EQ.1)GO TO 3
        RETURN
        END
        SUBROUTINE EDGGRAD(IA,IB,IC,NR,NC)
C*****************************************************************
C
C       FUNCTION:
C       THIS SUBROUTINE APPLIES FOUR GRADIENT MASKS TO AN INPUT ARRAY
C       AND THE LARGEST MAGNITUDE OF THE FOUR MASKS APPLIED TO A
C       PARTICULAR ARRAY ELEMENT IS TAKEN AS THE GRADIENT AT THAT POINT
C       IN THE INPUT ARRAY (OR IMAGE).  THE DIRECTION OF THE GRADIENT
C       IS DETERMINED BY THE PARTICULAR MASK THAT YIELDS THE LARGEST
C       MAGNITUDE AND BY THE SIGN OF THE APPLIED MASK.  THERE ARE A
C       TOTAL OF 8 DIRECTIONS 45 DEGREES APART.
C
C*****************************************************************
C
C       ARGUMENTS:
C
C       (INPUT)
C       IA   -   INTEGER*2. INPUT ARRAY TO BE OPERATED ON.
C       NR   -   INTEGER*2. NO. OF ROWS IN THE IMAGE ARRAY.
C       NC   -   INTEGER*2. NO. OF COLS IN THE IMAGE ARRAY.
C
C       (OUTPUT)
C       IB   -   INTEGER*2. OUTPUT GRADIENT MAGNITUDE MATRIX.
C       IC   -   INTEGER*2. OUTPUT GRADIENT DIRECTION MATRIX.
C
C*****************************************************************
C
C       NOTES:
C       THE GRADIENT MASKS ARE AS FOLLOWS.
C
C       -2 -1  0  1  2        0  1  2  2  2
C       -2 -1  0  1  2       -1  0  1  1  2
C       -2 -1  0  1  2       -2 -1  0  1  2
C       -2 -1  0  1  2       -2 -1 -1  0  1
C       -2 -1  0  1  2       -2 -2 -2 -1  0
C
C         (0 DEG)              (45 DEG)
C
```

```
C
C        2  2  2  2  2           2  2  2  1  0
C        1  1  1  1  1           2  1  1  0 -1
C        0  0  0  0  0           2  1  0 -1 -2
C       -1 -1 -1 -1 -1           1  0 -1 -1 -2
C       -2 -2 -2 -2 -2           0 -1 -2 -2 -2
C
C        (90 DEG)                (135 DEG)
C
C        IF THE SIGN OF THE APPLIED MASK IS NEGATIVE THEN THE
C        DIRECTION IS THE CORRESPONDING DIRECTION PLUS 180 DEGREES.
C
C***************************************************************
C
C        CREATION DATE:      28 FEBRUARY 1983
C
C***************************************************************
C
C        MODIFICATION HISTORY:
C
C***************************************************************
         INTEGER*2 NR,NC
         INTEGER*2 IA(NC,NR),IB(NC,NR),IC(NC,NR)
         INTEGER*2 ID(4),K,M,N
         N=0
C        INITIALIZE OUTPUT MATRICES TO 0
         DO 3 I=1,NR
         DO 3 J=1,NC
         IB(J,I)=0
3        IC(J,I)=0
C        APPLY GRADIENT MASKS TO IMAGE
         DO 1 I=3,NR-2
         DO 1 J=3,NC-2
         ID(1)=-2*(IA(J-2,I-2)+IA(J-2,I-1)+IA(J-2,I)+IA(J-2,I+1)+
        1IA(J-2,I+2))-1*(IA(J-1,I-2)+IA(J-1,I-1)+IA(J-1,I)+IA(J-1,I+1)+
        2IA(J-1,I+2))+IA(J+1,I-2)+IA(J+1,I-1)+IA(J+1,I)+IA(J+1,I+1)+
        3IA(J+1,I+2)+2*(IA(J+2,I-2)+IA(J+2,I-1)+IA(J+2,I)+IA(J+2,I+1)+
        4IA(J+2,I+2))
         ID(2)=-2*(IA(J-2,I)+IA(J-2,I+1)+IA(J-2,I+2)+IA(J-1,I+2)+
        1IA(J,I+2))-1*(IA(J-2,I-1)+IA(J-1,I)+IA(J-1,I+1)+IA(J,I+1)+
        2IA(J+1,I+2))+IA(J-1,I-2)+IA(J,I-1)+IA(J+1,I-1)+IA(J+1,I)+
        3IA(J+2,I+1)+2*(IA(J,I-2)+IA(J+1,I-2)+IA(J+2,I-2)+IA(J+2,I-1)+
        4IA(J+2,I))
         ID(3)=2*(IA(J-2,I-2)+IA(J-1,I-2)+IA(J,I-2)+IA(J+1,I-2)+
        1IA(J+2,I-2))+IA(J-2,I-1)+IA(J-1,I-1)+IA(J,I-1)+IA(J+1,I-1)+
        2IA(J+2,I-1)-(IA(J-2,I+1)+IA(J-1,I+1)+IA(J,I+1)+IA(J+1,I+1)+
        3IA(J+2,I+1))-(IA(J-1,I+2)+IA(J-1,I+2)+IA(J,I+2)+IA(J+1,I+2)+
        4IA(J+2,I+2))*2
         ID(4)=2*(IA(J-2,I)+IA(J-2,I-1)+IA(J-2,I-2)+IA(J-1,I-2)+
        1IA(J,I-2))+IA(J-2,I+1)+IA(J-1,I)+IA(J-1,I-1)+IA(J,I-1)+
        2IA(J+1,I-2)-(IA(J-1,I+2)+IA(J,I+1)+IA(J+1,I+1)+IA(J+1,I))+
        3IA(J+2,I-1))-(IA(J,I+2)+IA(J+1,I+2)+IA(J+2,I+2)+IA(J+2,I+1)+
        4IA(J+2,I))*2
         M=IIABS(ID(1))
         K=1
C        DETERMINE THE LARGEST GRADIENT FROM ABOVE MASKS
         DO 2 L=2,4
         IF(M.LT.IIABS(ID(L)))THEN
         K=L
         M=IIABS(ID(L))
         ENDIF
2        CONTINUE
         IB(J,I)=M
C        N WILL BE EQUAL TO THE LARGEST MAGNITUDE IN IB
         IF(M.GT.N)N=M
C        DETERMINE DIRECTION OF GRADIENT (RANGE IS 0 - 7)
         IC(J,I)=K-1+(IISIGN(1,ID(K))-1)*(-2)
1        CONTINUE
C        RESCALE IB MATRIX TO A MAX OF 255
         S=255./N
```

```
      DO 4 I=2,NR-1
      DO 4 J=2,NC-1
4     IB(J,I)=IB(J,I)*S
      RETURN
      END
      SUBROUTINE LEVCHG(IA,IB,NR,NC,ISR,ISC,ISIZE)
C*****************************************************************
C
C     FUNCTION:
C     THIS PROGRAM SETS ALL VALUES BELOW A THRESHOLD TO ZERO IN
C     AN INPUT IMAGE.
C
C*****************************************************************
C
C     ARGUMENTS:
C
C     INPUTS:
C     IA  -  INT*2. INPUT IMAGE.
C     NR  -  INT*2. NO. OF ROWS IN IMAGE.
C     NC  -  INT*2. NO. OF COLS IN IMAGE.
C     ISR -  STARTING ROW TO DISPLAY IMAGE ON RAMTEK
C     ISC -  STARTING COL TO DISPLAY IMAGE ON RAMTEK
C     ISIZE- ZOOM FACTOR FOR IMGTGR
C
C     OUTPUTS:
C     IB  -  INT*2. OUTPUT IMAGE.
C
C*****************************************************************
C
C     CREATION DATE:      18 MAY 1983
C
C*****************************************************************
C
C     MODIFICATION HISTORY:
C
C*****************************************************************
      INTEGER*2 NR,NC
      INTEGER*2 IA(NC,NR),IB(NC,NR)
2     TYPE*,'ENTER THRESHOLD FOR LEVCHG '
      ACCEPT*,ITHRSH
      DO 1 I=1,NR
      DO 1 J=1,NC
      IB(J,I) = IA(J,I)
      IF (IB(J,I).LE.ITHRSH) IB(J,I) = 0
1     CONTINUE
      CALL IMGTGR (IB,ISR,ISC,NR,NC,ISIZE)
C     CALL DOCUMENT(IB,NR,NC)
      TYPE*,'ENTER "1" TO CHANGE THRESHOLD'
      ACCEPT*,IGO
      IF (IGO.EQ.1) GO TO 2
      RETURN
      END
      SUBROUTINE LNCLSTR1(IB,IC,ID,IE,NR,NC,IAMB)
C*****************************************************************
C
C     THIS PROGRAM CLUSTERS FUZZY EDGES FROM A GRADIENT MAGNITUDE
C     MASK AND A GRADIENT DIRECTION MASK.
C
C*****************************************************************
C
C     ARGUMENTS:
C
C     INPUTS:
C     IB  -  INT*2. GRADIENT MAGNITUDE MASK
C     IC  -  INT*2. GRADIENT DIRECTION MASK
C     NR  -  INT*2. NO. OF ROWS
C     NC  -  INT*2. NO. OF COLS
C     IE  -  INT*2. WORKING MATRIX
C     IAMB-  AMBIGUITY LEVEL = 255
C
C     OUTPUTS:
```

```
C       ID  -  INT*2. CLUSTERED IMAGE
C
C****************************************************************
C
C       CREATION DATE:       18 MAY 1983
C
C****************************************************************
C
C       MODIFICATION HISTORY:
C
C****************************************************************
C
        INTEGER*2 NR,NC
        INTEGER*2 IB(NC,NR),IC(NC,NR)
        INTEGER*2 ID(NC,NR),IE(NC,NR)
        INTEGER*2 IDIR,MAX,M,ISUM,A(3),LONG,LAT
        INTEGER*2 MAXX,MAXY,MINX,MINY,MAXXL,MAXYL,MINXL,MINYL
C
C       INITIALIZE OUTPUT MATRIX IE TO 1 ON THE INTERIOR AND 0 AROUND
C       THE BORDER AND THE OUTPUT MATRIX ID TO 0 AROUND THE BORDER
C
        IMAX = 0
C
        DO 20 I = 1,NR
          DO 10 J = 1,NC
            IF (I .LT. 3 .OR. I .GT. NR-2 .OR.
     1          J .LT. 3 .OR. J .GT. NC-2) THEN
              ID(J,I) = 0
              IE(J,I) = 0
            ELSE
              IE(J,I) = 1
            ENDIF
10        CONTINUE
20      CONTINUE
C
C       THE ACTUAL GRADIENT IMAGE RANGES FROM (3,3) TO (NR-2,NC-2)
        DO 1 I=3,NR-2
        DO 2 J=3,NC-2
C
C       IF IE(J,I) IS EQUAL TO 0, THEN THE GRADIENT IMAGE IS NOT
C       OPERATED ON AT THIS POINT
C
        IF(IE(J,I).EQ.0)GO TO 2
C       DETERMINE THE DIRECTION STEPS, SUCH AS, LONG=1, LAT=1 FOR 45 DEG.
        IDIR=IC(J,I)
        DO 3 M=1,3
        A(M)=IDIR.AND.'0001'X
3       IDIR=IDIR/2
        LONG=.NOT.A(2).AND.'0001'X.OR.A(1)
        IF(A(3).XOR.A(2).EQ.1)LONG=-LONG
        LAT=A(2).OR.A(1)
        IF(A(3).EQ.0)LAT=-LAT
        MINX=J
        MINY=I
        MAXX=J
        MAXY=I
C       TRAVERSE IC MATRIX IN THE DIRECTION OF IC(J,I) AND DETERMINE THE
C       COORDINATES (MAXX,MAXY) WHERE IC CHANGES DIRECTION
        DO 5 M=1,NC+NR
        MAXXL=MAXX+LONG
        MAXYL=MAXY+LAT
        IF(IE(MAXXL,MAXYL).EQ.0.OR.IC(MAXXL,MAXYL).NE.IC(J,I))GO TO 6
        MAXX=MAXXL
        MAXY=MAXYL
5       CONTINUE
C       TRAVERSE IC MATRIX IN THE DIRECTION OF IC(J,I)+180 DEG. AND
C       DETERMINE THE COORDINATES (MINX,MINY) WHERE IC CHANGES DIRECTION
6       DO 7 M=1,NC+NR
        MINXL=MINX-LONG
        MINYL=MINY-LAT
        IF(IE(MINXL,MINYL).EQ.0.OR.IC(MINXL,MINYL).NE.IC(J,I))GO TO 8
        MINX=MINXL
```

```
      7        MINY=MINYL
      8        M=IMAX0(IIABS(MAXX-MINX),IIABS(MAXY-MINY))+1
               ISUM=0
               MAXX=MINX
               MAXY=MINY
               MAX=IB(MINX,MINY)
C              COMPUTE THE CLUSTERED LINE GRADIENT BETWEEN (MAXX,MAXY) AND
C              (MINX,MINY) BY SUMMING UP THE MAGNITUDES BETWEEN THESE TWO
C              POINTS ON THE IB MATRIX AND PLACING THE RESULT IN THE ID
C              MATRIX AT THE COORDINATE THAT HAD THE GREADTEST MAGNITUDE IN
C              THE IB MATRIX.  SET ALL OTHER POINTS EQUAL TO 0 BETWEEN THE
C              COORDINATES (MAXX,MAXY) AND (MINX,MINY) IN THE ID MATRIX.
               DO 9 L=1,M
               ID(MINX,MINY)=0
               IE(MINX,MINY)=0
               ISUM=IB(MINX,MINY)+ISUM
               IF(IB(MINX,MINY).GT.MAX)THEN
               MAX=IB(MINX,MINY)
               MAXX=MINX
               MAXY=MINY
               ENDIF
               MINX=MINX+LONG
               MINY=MINY+LAT
      9        CONTINUE
               ITEMP = ISUM/(M*1.0)
               ID(MAXX,MAXY)=ITEMP
               IF (ITEMP .GT. IMAX) THEN
                  IMAX = ITEMP
               ENDIF
      2        CONTINUE
      1        CONTINUE
C
               SCALE = IMAX/(IAMB-1.0)
               TYPE*,'LINE CLUSTER SCALE :',SCALE
C
               DO 40 I = 3,NR-2
                 DO 30 J = 3,NC-2
                   ID(J,I) = ID(J,I)/SCALE
      30         CONTINUE
      40       CONTINUE
C
               RETURN
               END
               SUBROUTINE BINIT(IA,IB,NR,NC,ISR,ISC,ISIZE)
C****************************************************************
C
C      FUNCTION:
C      THIS SUBROUTINE CREATES A BINARY IMAGE FROM AN INPUT IMAGE.
C      THE USER SPECIFIES A VALUE K SUCH THAT PELS ABOVE U+K*S ARE
C      SET TO 255; OTHERWISE THE PEL IS ASSIGNED A VALUE OF ZERO.
C      U IS THE COMPUTED MEAN AND S IS THE STANDARD DEVIATION OF THE
C      INPUT IMAGE.
C
C****************************************************************
C
C      ARGUMENTS:
C      (INPUTS)
C      IA    -   INT*2. THE INPUT IMAGE.
C      NR    -   INT*2. NO. OF ROWS IN IA.
C      NC    -   INT*2. NO. OF COLS IN IA.
C      ISR   -   STARTING ROW OF DISPLAYED OUTPUT.
C      ISC   -   STARTING COL OF DISPLAYED OUTPUT.
C      ISIZE-    SCALE FACTOR FOR IMGTGR.
C
C      (OUTPUTS)
C      IB    -   INT*2. THE COMPUTED BINARY IMAGE.
C
C****************************************************************
C
C      NOTES:
C      COMPUTES MEAN AND STD DEV ON NON-ZERO PIXELS
C
```

```
C***********************************************************************
C
C      CREATION DATE:      8 MARCH 1983
C
C***********************************************************************
C
C      MODIFICATION HISTORY:
C
C***********************************************************************
       INTEGER*2 NR,NC
       INTEGER*2 IA(NC,NR),IB(NC,NR)
       INTEGER*2 L
       S=0
       U=0
       L=0
C      COMPUTE THE MEAN
       DO 1 I=1,NR
       DO 1 J=1,NC
       IF(IA(J,I).GT.0)THEN
       U=U+IA(J,I)
       L=L+1
       ENDIF
1      CONTINUE
       U=U/L
C      COMPUTE THE STD DEVIATION
       DO 2 I=1,NR
       DO 2 J=1,NC
       IF(IA(J,I).GT.0)S=(IA(J,I)-U)**2+S
2      CONTINUE
       L=L-1
       S=S/L
       S=SQRT(S)
15     TYPE*,'MEAN, STD DEV - ',U,S
       TYPE*,'ENTER X FOR U+XS'
       ACCEPT*,X
       N=U+X*S
C      COMPUTE BINARY IMAGE
       DO 3 I=1,NR
       DO 3 J=1,NC
       IF(IA(J,I).GE.N)THEN
       IB(J,I)=255
       ELSE
       IB(J,I)=0
       ENDIF
3      CONTINUE
       CALL IMGTGR(IB,ISR,ISC,NR,NC,ISIZE)
C      CALL DOCUMENT(IB,NR,NC)
       TYPE*,'ENTER 1 TO CHANGE BINARY IMAGE THRESHOLD'
       ACCEPT*,IGO
       IF(IGO.EQ.1)GO TO 15
       RETURN
       END
C***********************************************************************
C
C      FUNCTION:
C      THIS SUBROUTINE IS DESIGNED TO IMPLEMENT AN IMAGE THINFILLING
C      PROCESS ON A BINARY IMAGE.
C
C***********************************************************************
C
C      ARGUMENTS:
C
C      (INPUTS)
C      IA    -    INT*2. INPUT IMAGE MATRIX
C      NR    -    INT*2. NO. OF ROWS IN THE IMAGE MATRIX
C      NC    -    INT*2. NO. OF COLS IN THE IMAGE MATRIX
C
C      (OUTPUTS)
C      IB    -    INT*2. THINFILLED OUTPUT IMAGE
C
C***********************************************************************
C
```

```
C       NOTES:
C       NONE
C
C********************************************************************
C
C       CREATION DATE:          14 MARCH 1983
C
C********************************************************************
C
C       MODIFICATION HISTORY:
C
C********************************************************************
        SUBROUTINE THINFILL(IA,IB,NR,NC)
        INTEGER*2 NR,NC
        INTEGER*2 IA(NC,NR),IB(NC,NR)
        INTEGER*2 IC(50),Z
        LOGICAL A,B,C,D,E,F,G,H
        DATA IC/0,7,11,22,41,59,62,79,87,91,93,94,95,
       1104,110,115,117,118,119,121,122,123,124,125,
       2224,148,208,220,232,158,242,211,203,155,217,218,
       3206,186,205,174,179,119,221,238,187,207,190,243,222,250/
        DO 2 I=1,NR
        DO 2 J=1,NC
2       IB(J,I)=0
        DO 1 I=2,NR-1
        DO 1 J=2,NC-1
        IB(J,I)=IA(J,I)
        A=IA(J-1,I-1).AND.1
        B=IA(J,I-1).AND.1
        C=IA(J+1,I-1).AND.1
        D=IA(J-1,I).AND.1
        E=IA(J+1,I).AND.1
        F=IA(J-1,I+1).AND.1
        G=IA(J,I+1).AND.1
        H=IA(J+1,I+1).AND.1
        Z=(((((((((((A*2)+B)*2)+C)*2)+D)*2)+E)*2)+F)*2)+G)*2+H
        DO 3 K=1,50
        IF(Z.EQ.IC(K))THEN
        IB(J,I)=0
        MM=A+B+C+D+E+F+G+H
        IF(MM.GT.4)IB(J,I)=255
        GO TO 1
        ENDIF
3       CONTINUE
1       CONTINUE
        RETURN
        END
C********************************************************************
C
C       FUNCTION:
C       THIS SUBROUTINE IS DESIGNED TO IMPLEMENT AN IMAGE THINNING
C       PROCESS ON A BINARY IMAGE.
C
C********************************************************************
C
C       ARGUMENTS:
C
C       (INPUTS)
C       IA      -   INT*2. INPUT IMAGE MATRIX
C       NR      -   INT*2. NO. OF ROWS IN THE IMAGE MATRIX
C       NC      -   INT*2. NO. OF COLS IN THE IMAGE MATRIX
C
C       (OUTPUTS)
C       IB      -   INT*2. THINNED OUTPUT IMAGE
C
C********************************************************************
C
C       NOTES:
C       NONE
C
C********************************************************************
C
```

```
C      CREATION DATE:        8 MARCH 1983
C
C***********************************************************************
C
C   . MODIFICATION HISTORY:
C
C***********************************************************************
       SUBROUTINE THINLN(IA,IB,NR,NC)
       INTEGER*2 NR,NC
       INTEGER*2 IA(NC,NR),IB(NC,NR)
       INTEGER*2 IC(12),Z1,Z2,Z3,Z4
       LOGICAL A,B,C,D,E,F,G,H
       DATA IC/0,7,11,15,22,23,31,43,47,150,151,191/
       DO 2 I=1,NR
       DO 2 J=1,NC
2      IB(J,I)=0
       DO 1 I=2,NR-1
       DO 1 J=2,NC-1
       IB(J,I)=IA(J,I)
       A=IA(J-1,I-1).AND.1
       B=IA(J,I-1).AND.1
       C=IA(J+1,I-1).AND.1
       D=IA(J-1,I).AND.1
       E=IA(J+1,I).AND.1
       F=IA(J-1,I+1).AND.1
       G=IA(J,I+1).AND.1
       H=IA(J+1,I+1).AND.1
       Z1=(((((((((((A*2)+B)*2)+C)*2)+D)*2)+E)*2)+F)*2)+G)*2+H
       Z2=(((((((((((H*2)+G)*2)+F)*2)+E)*2)+D)*2)+C)*2)+B)*2+A
       Z3=(((((((((((C*2)+E)*2)+H)*2)+B)*2)+G)*2)+A)*2)+D)*2+F
       Z4=(((((((((((F*2)+D)*2)+A)*2)+G)*2)+B)*2)+H)*2)+E)*2+C
       DO 1 K=1,12
       IF(Z1.EQ.IC(K).OR.Z2.EQ.IC(K).OR.Z3.EQ.IC(K).OR.Z4.EQ.IC(K))
      1IB(J,I)=0
1      CONTINUE
       RETURN
       END
       SUBROUTINE MERGESLIT(IA,IB,NR,NC,IX1,IY1,IX2,IY2,INDEX)
C***********************************************************************
C
C      FUNCTION:
C      THIS SUBROUTINE IMPLEMENTS THE MERGE-SLIT ALGORITHM
C
C***********************************************************************
C
C      ARGUMENTS:
C
C      (INPUTS)
C      IA    -   INT*2.  THE INPUT BINARY IMAGE ARRAY.
C      NR    -   INT*2.  NO. OR ROWS IN IA.
C      NC    -   INT*2.  NO. OF COLS IN IA.
C
C      (OUTPUTS)
C      IB    -   INT*2.  THE OUTPUT BINARY IMAGE ARRAY.
C
C***********************************************************************
C
C      NOTES:
C      NONE
C
C***********************************************************************
C
C      CREATION DATE:        MARCH 28,1983
C
C***********************************************************************
C
C      MODIFICATION HISTORY:
C
C***********************************************************************
       INTEGER*2 NR,NC
       INTEGER*2 IA(NC,NR),IB(NC,NR)
       INTEGER*2 ISP(16,9,9),IX1(1),IX2(1),IY1(1),IY2(1)
```

```
          INTEGER*2 X1,X2,Y1,Y2,X,Y,INDEX
          INDEX=0
C     DEFINE THE POSSIBLE LINE SEGMENTS
          CALL GENSLT(ISP,9,16)
          TYPE*,'ENTER SLIT VALUE THRESHOLD'
C     ITHRSH HAS A VALUE BETWEEN 0 AND 9
          ACCEPT*,ITHRSH
          ITHRSH=ITHRSH*255
C         ITHRSH=ITHRSH*9
C     TWO LINES WILL MERGE IF THEIR ENDPOINTS ARE WITHIN THRSH DISTANCE
C     OF THE OTHER LINE
          TYPE*,'ENTER MERGE DISTANCE THRESHOLD'
          ACCEPT*,THRSH
          TYPE*,'ENTER MAXIMUM DISTANCE FOR A MERGE'
          ACCEPT*,DIST
C     OPERATE ON EVERY THIRD PIXEL
          DO 1 I=5,NR-5,1
          DO 1 J=5,NC-5,1
          ISUM1=0
          ISUM3=0
          DO 2 K=1,16
C     USE ONLY 8 LINES DEFINED IN ISP ARRAY
C         IF(K.EQ.2.OR.K.EQ.3.OR.K.EQ.6.OR.K.EQ.7.OR.K.EQ.11.OR.K.EQ.12
C        1.OR.K.EQ.15.OR.K.EQ.16)GO TO 2
          ISUM=0
C         ISUM2=0
          DO 3 L=1,9
          DO 3 M=1,9
          IF(ISP(K,M,L).NE.0)THEN
               IF(M.EQ.1.OR.L.EQ.1)THEN
                    X=M
                    Y=L
               ENDIF
C     IF K.LE.8 THEN LOGICALLY .OR. ABOVE AND BELOW PIXEL TO GET
C     ACTUAL PIXEL VALUE FOR DETERMINING LINE REQUIREMENTS, ELSE
C     LOGICALLY .OR. PIXELS TO LEFT AND RIGHT OF LINE PIXEL.
C         IF(K.LE.8)THEN
C              ISUM=(IA(J-5+M,I-4+L).OR.2*IA(J-5+M,I-5+L).OR.
C        1     IA(J-5+M,I-6+L))+ISUM
C              ISUM2=(IA(J-5+M,I-4+L).OR.IA(J-5+M,I-5+L).OR.
C        1     IA(J-5+M,I-6+L))+ISUM2
C         ELSE
C              ISUM=(IA(J-4+M,I-5+L).OR.2*IA(J-5+M,I-5+L).OR.
C        1     IA(J-6+M,I-5+L))+ISUM
C              ISUM2=(IA(J-4+M,I-5+L).OR.IA(J-5+M,I-5+L).OR.
C        1     IA(J-6+M,I-5+L))+ISUM2
C         ENDIF
          ISUM=IA(J-5+M,I-5+L)+ISUM
C         IF(ISUM.NE.0)TYPE*,'ISUM',ISUM
          ENDIF
3         CONTINUE
C     IF ISUM MEETS THRESHOLD REQUIREMENT THEN X1,Y1,X2,Y2 ARE LINE
C     SEGMENT ENDPOINTS
          IF(ISUM.GT.ISUM1.AND.ISUM.GE.ITHRSH)THEN
               ISUM1=ISUM
               ISUM3=ISUM
               X1=J-5+X
               X2=J+5-X
               Y1=I-5+Y
               Y2=I+5-Y
          ENDIF
2         CONTINUE
C     CALL MERGE TO MERGE NEW LINE SEGEMENT WITH ALREADY EXISTING
C     LINE SEGMENTS DEFINED BY IX1,IY1,IX2,IY2.  TWO LINES MERGE
C     IF THEIR ENDPOINT DISTANCES ARE WITHIN THRSH OF THE OTHER LINE.
C         TYPE*,'ISUM3,ITHRSH',ISUM3,ITHRSH
          IF(ISUM3.GE.ITHRSH)
         1CALL MERGE(X1,Y1,X2,Y2,INDEX,IX1,IY1,IX2,IY2,THRSH,DIST)
1         CONTINUE
C     USE LINE ENDPOINTS TO COMPUTE ACTUAL LINES AND STORE IN IB
          CALL VLINE1(IX1,IY1,IX2,IY2,INDEX,IB,NR,NC)
          CALL IMGTGR(IB,191,160,NR,NC,0)
C         CALL DOCUMENT(IB,NR,NC)
```

```
        TYPE*,'ENTER 1 FOR FINAL EDITING'
        ACCEPT*,IGO
        IF(IGO.NE.1)RETURN
        CALL REMERGE(IX1,IY1,IX2,IY2,INDEX,THRSH,DIST)
        CALL VLINE1(IX1,IY1,IX2,IY2,INDEX,IB,NR,NC)
        RETURN
        END
C
        SUBROUTINE MERGE(X1,Y1,X2,Y2,INDEX,IX1,IY1,IX2,IY2,THRSH,DIST)
        INTEGER*2 X1,Y1,X2,Y2,INDEX,IX1(1),IY1(1),IX2(1),IY2(1)
        REAL*4 S(6),S7
        DX1=X2-X1
        DY1=Y2-Y1
        S(1)=SQRT(DX1**2+DY1**2)
        IF(INDEX.EQ.0)GO TO 9
        DO 7 I=1,INDEX
        DX2=IX2(I)-IX1(I)
        DY2=IY2(I)-IY1(I)
        S(2)=SQRT(DX2**2+DY2**2)
19      SX1=X2-IX2(I)
        SY1=Y2-IY2(I)
        SS1=ABS(SX1*DY2-SY1*DX2)/S(2)
        SS2=ABS(SX1*DY1-SY1*DX1)/S(1)
        SX2=X1-IX1(I)
        SY2=Y1-IY1(I)
        SS3=ABS(SX2*DY1-SY2*DX1)/S(1)
        SS4=ABS(SX2*DY2-SY2*DX2)/S(2)
        SS=MAX(SS1,SS2,SS3,SS4)
        IF(SS.GT.THRSH)GO TO 7
        S(3)=SQRT(SX1**2+SY1**2)
        S(4)=SQRT(SX2**2+SY2**2)
        S(5)=SQRT(FLOAT((X2-IX1(I))**2+(Y2-IY1(I))**2))
        S(6)=SQRT(FLOAT((X1-IX2(I))**2+(Y1-IY2(I))**2))
        S7=AMIN1(S(3),S(4),S(5),S(6))
        IF(S7.GT.DIST)GO TO 9
        S7=S(1)
        M=1
        S7=S(1)
        DO 8 J=2,6
        IF(S(J).GT.S7)THEN
                S7=S(J)
                M=J
        ENDIF
8       CONTINUE
        GO TO (1,2,3,4,5,6)M
        TYPE*,'ERROR IN MERGE COMPARISON'
        STOP
1       IX1(I)=X1
        IY1(I)=Y1
        IX2(I)=X2
        IY2(I)=Y2
2       RETURN
3       IX1(I)=X2
        IY1(I)=Y2
        RETURN
4       IX2(I)=X1
        IY2(I)=Y1
        RETURN
5       IX2(I)=X2
        IY2(I)=Y2
        RETURN
6       IX1(I)=X1
        IY1(I)=Y1
        RETURN
7       CONTINUE
9       INDEX=INDEX+1
        IX1(INDEX)=X1
        IY1(INDEX)=Y1
        IX2(INDEX)=X2
        IY2(INDEX)=Y2
        RETURN
        END
```

```
C       SUBROUTINE REMERGE(IX1,IY1,IX2,IY2,INDEX,THRSH,DIST)
        INTEGER*2 X1,Y1,X2,Y2,INDEX,IX1(1),IY1(1),IX2(1),IY2(1)
        REAL*4 S(6),S7
        TYPE*,'ENTER MAXIMUM MERGE DISTANCE'
        ACCEPT*,DMAX
        TYPE*,'ENTER SHORTEST LINE THRESHOLD'
        ACCEPT*,DMIN
        INDEX1=INDEX
11      INDEX=INDEX1
        DO 12 J=1,INDEX
        X1=IX1(J)
        Y1=IY1(J)
        X2=IX2(J)
        Y2=IY2(J)
        DO 7 I=1,INDEX
        IF(I.EQ.J)GO TO 7
        DX1=X2-X1
        DY1=Y2-Y1
        S(1)=SQRT(DX1**2+DY1**2)
        DX2=IX2(I)-IX1(I)
        DY2=IY2(I)-IY1(I)
        S(2)=SQRT(DX2**2+DY2**2)
19      SX1=X2-IX2(I)
        SY1=Y2-IY2(I)
        SS1=ABS(SX1*DY2-SY1*DX2)/S(2)
        SS2=ABS(SX1*DY1-SY1*DX1)/S(1)
        SX2=X1-IX1(I)
        SY2=Y1-IY1(I)
        SS3=ABS(SX2*DY1-SY2*DX1)/S(1)
        SS4=ABS(SX2*DY2-SY2*DX2)/S(2)
        SS=MAX(SS1,SS2,SS3,SS4)
        IF(SS.GT.THRSH)GO TO 7
        S(3)=SQRT(SX1**2+SY1**2)
        S(4)=SQRT(SX2**2+SY2**2)
        S(5)=SQRT(FLOAT((X2-IX1(I))**2+(Y2-IY1(I))**2))
        S(6)=SQRT(FLOAT((X1-IX2(I))**2+(Y1-IY2(I))**2))
        S7=AMIN1(S(3),S(4),S(5),S(6))
        IF(S7.GT.DIST)GO TO 7
        S7=S(1)
        M=1
        S7=S(1)
        DO 8 JJ=2,6
        IF(S(JJ).GT.S7)THEN
                S7=S(JJ)
                M=JJ
        ENDIF
8       CONTINUE
        GO TO (1,2,3,4,5,6)M
        TYPE*,'ERROR IN MERGE COMPARISON'
        STOP
1       IX1(I)=X1
        IY1(I)=Y1
        IX2(I)=X2
        IY2(I)=Y2
2       GO TO 9
3       IX1(I)=X2
        IY1(I)=Y2
        GO TO 9
4       IX2(I)=X1
        IY2(I)=Y1
        GO TO 9
5       IX2(I)=X2
        IY2(I)=Y2
        GO TO 9
6       IX1(I)=X1
        IY1(I)=Y1
        GO TO 9
9       INDEX1=INDEX-1
        DO 10 M=J,INDEX1
        IX1(M)=IX1(M+1)
        IY1(M)=IY1(M+1)
```

```
              IX2(M)=IX2(M+1)
10            IY2(M)=IY2(M+1)
              GO TO 11
7         CONTINUE
12        CONTINUE
              THRSH=THRSH+1
              IF(THRSH.LE.DMAX)GO TO 11
              DO 15 I=1,INDEX
18            IF(I.GT.INDEX1)GO TO 14
              D=(IX2(I)-IX1(I))**2+(IY2(I)-IY1(I))**2
              IF(SQRT(D).GT.DMIN)GO TO 15
              INDEX1=INDEX1-1
              DO 17 J=I,INDEX1
              IX1(J)=IX1(J+1)
              IY1(J)=IY1(J+1)
              IX2(J)=IX2(J+1)
17            IY2(J)=IY2(J+1)
              GO TO 18
15        CONTINUE
14        INDEX=INDEX1
              RETURN
              END
C
              SUBROUTINE VLINE(IX1,IY1,IX2,IY2,INDEX,IB,NR,NC)
C*****************************************************************
C
C     THIS PROGRAM TAKES LINE ENDPOINTS (IX1,IY1) AND (IX2,IY2) AND
C     FILLS IN THE PIXELS ON THESE LINES IN OUTPUT MATRIX IB.
C
C*****************************************************************
C
C     ARGUMENTS:
C
C     INPUTS:
C     IX1,IY1,IX2,IY2  -  INPUT LINE ENDPOINTS.
C     INDEX   -   NO. OF LINES
C     NR      -   NO. OF ROWS IN IB
C     NC      -   NO. OF COLS IN IB
C
C*****************************************************************
              INTEGER*2 INDEX,NR,NC
              INTEGER*2 IX1(1),IY1(1),IX2(1),IY2(1),IB(NC+1,NR)
              DO 1 I=1,NR
              DO 1 J=1,NC
1             IB(J,I)=0
              DO 2 I=1,INDEX
              IF(IX1(I).LT.1.OR.IX1(I).GT.NC.OR.IY1(I).LT.1.OR.IY1(I).GT.NC)GOTO337
              IB(IX1(I),IY1(I))=255
337           ISIGNX=ISIGN(1,IX2(I)-IX1(I))
              ISIGNY=ISIGN(1,IY2(I)-IY1(I))
              IF(IABS(IY2(I)-IY1(I)).GT.IABS(IX2(I)-IX1(I)))GO TO 3
              NX1=0
              DELTAY=FLOAT(IY2(I)-IY1(I))/FLOAT(IX2(I)-IX1(I))
4             NX1=NX1+ISIGNX
              NY1=JNINT(IY1(I)+DELTAY*NX1)
              IF(NX1+IX1(I).GT.NC.OR.NX1+IX1(I).LT.1.OR.NY1.GT.NR.OR.NY1.LT.1)
             1GO TO 58
17            IB(NX1+IX1(I),NY1)=255
58            IF(NX1+IX1(I).EQ.IX2(I).AND.NY1.EQ.IY2(I))GO TO 2
              GO TO 4
3             NY1=0
              DELTAX=FLOAT(IX2(I)-IX1(I))/FLOAT(IY2(I)-IY1(I))
5             NY1=NY1+ISIGNY
              NX1=JNINT(IX1(I)+DELTAX*NY1)
              IF(NX1.GT.NC.OR.NX1.LT.1.OR.NY1+IY1(I).GT.NR.OR.NY1+IY1(I).LT.1)
             1GO TO 59
18            IB(NX1,NY1+IY1(I))=255
59            IF(.NOT.(NX1.EQ.IX2(I).AND.NY1+IY1(I).EQ.IY2(I)))GO TO 5
2         CONTINUE
              RETURN
              END
```

```
      SUBROUTINE GENSLT(ISP,ISLT,INSLT)
      INTEGER*2 ISLT,IDEN,IX,IY,KSLIT,INSLT
      INTEGER*2 ISP(INSLT,ISLT,ISLT)
      IDEN=(ISLT-1)/2
      KSLIT=0
      DO 4 I=1,ISLT
      DO 4 J=1,ISLT
      DO 4 K=1,INSLT
      ISP(K,J,I)=0
4     CONTINUE
      IVALUE=(ISLT+1)/2
      DO 3 IJ=1,ISLT
      ISP(KSLIT+1,IJ,IVALUE)=1
3     CONTINUE
      DO 21 K=1,IDEN
      KSLIT=KSLIT+2
      DO 2 IX=(-IVALUE+1),(IVALUE-1)
      IY=IFIX(FLOAT(K)/FLOAT(IDEN)*FLOAT(IX)+IISIGN(1,IX)*0.5)
      ISP(KSLIT,IX+IDEN+1,IY+IDEN+1)=1
      ISP(KSLIT+1,IX+IDEN+1,-IY+IDEN+1)=1
2     CONTINUE
21    CONTINUE
      DO 6 IJ=1,ISLT
      ISP(KSLIT+2,IVALUE,IJ)=1
6     CONTINUE
      DO 22 K=1,(IDEN-1)
      KSLIT=KSLIT+2
      DO 31 IY=(-IVALUE+1),(IVALUE-1)
      IX=IFIX(FLOAT(IDEN-K)/FLOAT(IDEN)*FLOAT(IY)+IISIGN(1,IY)*0.5)
      ISP(KSLIT+1,IX+IDEN+1,IY+IDEN+1)=1
      ISP(KSLIT+2,-IX+IDEN+1,IY+IDEN+1)=1
31    CONTINUE
22    CONTINUE
C     DO 111 K=1,INSLT
C     WRITE(4,9001)
C     WRITE(4,9000) ((ISP(K,I,J),I=1,ISLT),J=1,ISLT)
C 111 CONTINUE
C 9001 FORMAT(///)
C 9000 FORMAT(9(1X,I1))
      RETURN
      END
      DIMENSION BNVX(50),BNVY(50),BNVC(50)
      DIMENSION BNLX1(50),BNLY1(50),BNLX2(50),BNLY2(50)
      DIMENSION RNVX(50),RNVY(50),RNVC(50)
      DIMENSION RNLX1(50),RNLY1(50),RNLX2(50),RNLY2(50)
      DIMENSION ANVX(50),ANVY(50),ANVC(50)
      DIMENSION ANLX1(50),ANLY1(50),ANLX2(50),ANLY2(50)
      DIMENSION X(50),Y(50),C(50),NR(50),T(50)
      DIMENSION RR(50,50),AA(50,50),BB(50,50)
      DIMENSION XS(50),YS(50),CS(50),NRS(50),TS(50)
      DIMENSION RRS(50,50),AAS(50,50),BBS(50,50)
      DIMENSION DLTX(700),DLTY(700),DLTHA(700),MSCOR(700)
      INTEGER*2 NL,NLX1(50),NLY1(50),NLX2(50),NLY2(50),NLR
      INTEGER*2 NV,NVX(50),NVY(50),NVC(50),NVR
C
C
      OPEN(UNIT=2,NAME='F00001.DAT',FORM='UNFORMATTED',TYPE='OLD')
      OPEN(UNIT=3,NAME='F00003.DAT',FORM='UNFORMATTED',TYPE='OLD')
      READ(3) NLR
      DO 1006 I=1,NLR
      READ(3) NLX1(I),NLY1(I),NLX2(I),NLY2(I)
1006  CONTINUE
      READ(3) NVR
      DO 1007 I=1,NVR
      READ(3) NVX(I),NVY(I),NVC(I)
1007  CONTINUE
      CLOSE(UNIT=3)
      DO 1008 I=1,NVR
      IF(NVC(I).GT.3) NVC(I)=2
1008  CONTINUE
      TYPE *,'NVR=',NVR,'     NLR=',NLR
C     DO 1010 I=1,NVR
```

```
C         WRITE(6,100) NVX(I),NVY(I),NVC(I)
C 1010    CONTINUE
C         DO 1011 I=1,NLR
C         WRITE(6,101) NLX1(I),NLY1(I),NLX2(I),NLY2(I)
C 1011    CONTINUE
C
C         CONVERT REFERENCE DATAS INTO REAL VALUES
C
          DO 1021 I=1,NVR
          BNVX(I)=FLOAT(NVX(I))
          BNVY(I)=FLOAT(NVY(I))
 1021     BNVC(I)=FLOAT(NVC(I))
          DO 1022 I=1,NLR
          BNLX1(I)=FLOAT(NLX1(I))
          BNLY1(I)=FLOAT(NLY1(I))
          BNLX2(I)=FLOAT(NLX2(I))
 1022     BNLY2(I)=FLOAT(NLY2(I))
          NROW=150
          NCOL=150
          CALL RIVGEN1(NVR,BNVX,BNVY,BNVC,NLR,BNLX1,BNLY1,BNLX2,BNLY2
         1,NROW,NCOL,X,Y,C,RR,AA,BB,NN,NR,T)
C         DO 20 I=1,NN
C         WRITE(6,150) X(I),Y(I),C(I),NR(I),T(I)
C 150     FORMAT(1H ,1X,3(2X,F7.2),2X,I3,2X,F7.2)
C         DO 20 J=1,NR(I)
C         WRITE(6,180) RR(I,J),AA(I,J),BB(I,J)
C 180     FORMAT(1X,3(F7.2,2X))
C 20      CONTINUE
          READ(2) NL
          DO 1000 I=1,NL
          READ(2) NLX1(I),NLY1(I),NLX2(I),NLY2(I)
 1000     CONTINUE
          READ(2) NV
          DO 1001 I=1,NV
          READ(2) NVX(I),NVY(I),NVC(I)
 1001     CONTINUE
          CLOSE(UNIT=2)
          DO 1005 I=1,NV
          IF(NVC(I).GT.3) NVC(I)=2
 1005     CONTINUE
          TYPE*,'NV=',NV,'      NL=',NL
          INV=NV
          INL=NL
C         DO 10 I=1,NV
C         WRITE(6,100) NVX(I),NVY(I),NVC(I)
C 100     FORMAT(1H ,1X,3(I3,2X))
C 10      CONTINUE
C         DO 11 I=1,NL
C         WRITE(6,101) NLX1(I),NLY1(I),NLX2(I),NLY2(I)
C 101     FORMAT(1H ,1X,4(I3,2X))
C 11      CONTINUE
C
C         CONVERT THE INPUT DATAS INTO THE REAL VALUES
C
 15       DO 21 I=1,NV
          ANVX(I)=FLOAT(NVX(I))
          ANVY(I)=FLOAT(NVY(I))
 21       ANVC(I)=FLOAT(NVC(I))
          DO 22 I=1,NL
          ANLX1(I)=FLOAT(NLX1(I))
          ANLY1(I)=FLOAT(NLY1(I))
          ANLX2(I)=FLOAT(NLX2(I))
 22       ANLY2(I)=FLOAT(NLY2(I))
          IXI=1
          IYI=1
          NROW=150
          NCOL=150
          TYPE *,' PARAMETERS OF THE SENSED FEATURE(150x150)'
          TYPE 200, IXI,IYI,NCOL,NROW
 200      FORMAT(1H0, 1X,'IXI=',I3,2X,'IYI=',I3,2X,'NCOL=',I3,2X,
         1'NROW=',I3)
```

```
C
C       SUBFEATURE GENDERATION
C
        TYPE *,'ENTER IXI,IYI,IXF,IYF FOR THE X-Y COORDINATES OF
      1 SUBIMAGE FEATURE'
        ACCEPT *,IXI,IYI,IXF,IYF
        XI=FLOAT(IXI)
        YI=FLOAT(IYI)
        XF=FLOAT(IXF)
        YF=FLOAT(IYF)
        L=0
        I=1
1       IF(ANVX(I).LT.XI.OR.ANVX(I).GT.XF) GO TO 5
        IF(ANVY(I).LT.YI.OR.ANVY(I).GT.YF) GO TO 5
        L=L+1
        ANVX(L)=ANVX(I)-XI+1.0
        ANVY(L)=ANVY(I)-YI+1.0
        ANVC(L)=ANVC(I)
5       I=I+1
        IF(I.LE.NV) GO TO 1
        NV=L
        L=0
        I=1
2       IF(ANLX1(I).LT.XI.OR.ANLX1(I).GT.XF) GO TO 6
        IF(ANLY1(I).LT.YI.OR.ANLY1(I).GT.YF) GO TO 6
        L=L+1
        ANLX1(L)=ANLX1(I)-XI+1.0
        ANLY1(L)=ANLY1(I)-YI+1.0
        ANLX2(L)=ANLX2(I)-XI+1.0
        ANLY2(L)=ANLY2(I)-YI+1.0
        GO TO 7
6       IF(ANLX2(I).LT.XI.OR.ANLX2(I).GT.XF) GO TO 7
        IF(ANLY2(I).LT.YI.OR.ANLY2(I).GT.YF) GO TO 7
        L=L+1
        ANLX1(L)=ANLX1(I)-XI+1.0
        ANLY1(L)=ANLY1(I)-YI+1.0
        ANLX2(L)=ANLX2(I)-XI+1.0
        ANLY2(L)=ANLY2(I)-YI+1.0
7       I=I+1
        IF(I.LE.NL) GO TO 2
        NL=L
        TYPE *,'ENTER NROW AND NCOL OF SUBFEATURE'
        ACCEPT *,NROW,NCOL
C
C       MODEL FEATURE ROTATION BY THE SPECIFIED ANGLE
C
        TYPE *,'ENTER ANGLE FOR ROTATION IN DEGREE'
        ACCEPT *,ANG
        ANG=ANG/180.*3.14159
        COSA=COS(ANG)
        SINA=SIN(ANG)
        XO=FLOAT(NCOL/2)
        YO=FLOAT(NROW/2)
        DO 500 I=1,NV
        RVX=ANVX(I)-XO
        RVY=ANVY(I)-YO
        RNVX(I)=RVX*COSA+RVY*SINA
        RNVY(I)=RVY*COSA-RVX*SINA
        RNVX(I)=RNVX(I)+XO
        RNVY(I)=RNVY(I)+YO
        RNVC(I)=ANVC(I)
500     CONTINUE
        DO 501 I=1,NL
        RLX=ANLX1(I)-XO
        RLY=ANLY1(I)-YO
        RNLX1(I)=RLX*COSA+RLY*SINA
        RNLY1(I)=RLY*COSA-RLX*SINA
        RLX=ANLX2(I)-XO
        RLY=ANLY2(I)-YO
        RNLX2(I)=RLX*COSA+RLY*SINA
        RNLY2(I)=RLY*COSA-RLX*SINA
        RNLX1(I)=RNLX1(I)+XO
```

```
            RNLY1(I)=RNLY1(I)+YO
            RNLX2(I)=RNLX2(I)+XO
            RNLY2(I)=RNLY2(I)+YO
    501     CONTINUE
            L=0
            I=1
    502     IF(RNVX(I).LT.1.0.OR.RNVX(I).GT.XO*2.) GO TO 503
            IF(RNVY(I).LT.1.0.OR.RNVY(I).GT.YO*2.) GO TO 503
            L=L+1
            RNVX(L)=RNVX(I)
            RNVY(L)=RNVY(I)
            RNVC(L)=RNVC(I)
    503     I=I+1
            IF(I.LE.NV) GO TO 502
            NV=L
            L=0
            I=1
    504     IF(RNLX1(I).LT.1.0.OR.RNLX1(I).GT.XO*2.) GO TO 515
            IF(RNLY1(I).LT.1.0.OR.RNLY1(I).GT.YO*2.) GO TO 515
            L=L+1
            RNLX1(L)=RNLX1(I)
            RNLY1(L)=RNLY1(I)
            RNLX2(L)=RNLX2(I)
            RNLY2(L)=RNLY2(I)
            GO TO 505
    515     IF(RNLX2(I).LT.1.0.OR.RNLX2(I).GT.XO*2.) GO TO 505
            IF(RNLY2(I).LT.1.0.OR.RNLY2(I).GT.YO*2.) GO TO 505
            L=L+1
            RNLX1(L)=RNLX1(I)
            RNLY1(L)=RNLY1(I)
            RNLX2(L)=RNLX2(I)
            RNLY2(L)=RNLY2(I)
    505     I=I+1
            IF(I.LE.NL) GO TO 504
            NL=L
    C       DO 506 I=1,NV
    C       WRITE(6,510) RNVX(I),RNVY(I),RNVC(I)
    C510    FORMAT(1H0,1X,3(F7.2,2X))
    C506    CONTINUE
    C       DO 507 I=1,NL
    C       WRITE(6,511) RNLX1(I),RNLY1(I),RNLX2(I),RNLY2(I)
    C511    FORMAT(1H0,1X,4(F7.2,2X))
    C507    CONTINUE
            CALL RIVGEN1(NV,RNVX,RNVY,RNVC,NL,RNLX1,RNLY1,RNLX2,RNLY2
           1,NROW,NCOL,XS,YS,CS,RRS,AAS,BBS,NNS,NRS,TS)
            IF(NNS.EQ.0) GO TO 522
    C       DO 520 I=1,NNS
    C       WRITE(6,150) XS(I),YS(I),CS(I),NRS(I),TS(I)
    C       DO 520 J=1,NRS(I)
    C       WRITE(6,180) RRS(I,J),AAS(I,J),BBS(I,J)
    C 520   CONTINUE
            CALL RIVCMP1(XS,YS,CS,X,Y,C,RRS,AAS,BBS,TS,T,RR,AA,BB
           1,NRS,NR,NNS,NN,MSCOR,DLTX,DLTY,DLTHA,NDL,XO,YO)
    521     TYPE *,'ENTER "1" IF CONTINUED'
            ACCEPT *,IANS
            IF(IANS.NE.1) GO TO 600
            NV=INV
            NL=INL
            GO TO 15
    522     TYPE *,'NO NEIGHBOR AVAILABLE'
            GO TO 521
    600     STOP
            END
            SUBROUTINE RIVGEN1(NV,VX,VY,VC,NL,X1,Y1,X2,Y2
           1,NROW,NCOL,X,Y,C,RR,AA,BB,NN,NR,THETA)
    C
    C       THIS ROUTINE GENERATES RELATIVE INFORMATION VECTOR(RIV)
    C       LIST FROM A GIVEN FEATURE LISTS INCLUDING THE COORDINATES
    C       OF VERTICES AND LINE SEGMENTS.
    C
    C       NV......TOTAL NUMBER OF VERTICES
```

```
C       VX,VY..COORDINATES OF VERTICES
C       VC.....CLASS OF VERTEX
C       X1,Y1,X2,Y2...COORDINATES OF
C              LINE SEGMENT END POINTS
C       NROW,NCOL..FEATURE IMAGE SIZE
C       X,Y...COORDINATES OF FEATURE CORE
C       C......CLASS OF FEATURE CORE
C       RR,AA,BB..SORTED PARAMETERS OF RIV DEFINITION
C       NN.....:INDEX OF FEATURE CORE
C       NR......NUMBER OF NEIGHBORS AT A GIVEN CORE
C       THETA...ORIENTATION ANGLE OF THE NEAREST SATELITE
C              AT A GIVEN CORE
        INTEGER*2 NV,NL
        DIMENSION VX(NV),VY(NV),X1(NL),Y1(NL),X2(NL),Y2(NL)
        DIMENSION X(NV),Y(NV),C(NV),VC(NV)
        DIMENSION R(250),A(250),B(250),NR(250),THETA(250)
        DIMENSION RR(250,250),AA(250,250),BB(250,250)
C       TYPE 100
C 100   FORMAT(1H0,1X,'TYPE NUMBER FOR MAX.RADIUS OF
C       1 THE NEIGHBOR RANGE......',$)
C       ACCEPT 101,MR
C 101   FORMAT(I2)
C 50    TYPE *,'ENTER "1" FOR VERTEX MODE OR "2" FOR LINE MODE'
C       ACCEPT *,MOD
        MR=40
        MOD=2
C       IF(MOD.NE.1.AND.MOD.NE.2)GO TO 50
        BMR=FLOAT(MR)
        BCOL=FLOAT(NCOL-MR+1)
        BROW=FLOAT(NROW-MR+1)
        VCLS=3.0
        NN=0
   1    I=1
   5    IF(VC(I).NE.VCLS) GO TO 15
        IF(VX(I).GE.BMR.AND.VX(I).LE.BCOL) GO TO 10
C       IF(VY(I).LT.BMR.OR.VY(I).GT.BROW) GO TO 15
C
  10    CX=VX(I)
        CY=VY(I)
        CALL NGBR1(CX,CY,VX,VY,X1,Y1,X2,Y2,NV,NL,
        1NBCNT,R,A,B,MR,MOD)
        NN=NN+1
        CALL NBSORT(NBCNT,R,A,B,RR,AA,BB,NN,NV)
        X(NN)=CX
        Y(NN)=CY
        C(NN)=VCLS
        NR(NN)=NBCNT
C       WRITE(6,150) X(NN),Y(NN),C(NN),NR(NN)
C150    FORMAT(1H ,3(2X,F5.2),2X,I3)
C       NB=NR(NN)
C       WRITE(6,160) (R(J),A(J),B(J),RR(NN,J),AA(NN,J),BB(NN,J),J=1,NB)
C160    FORMAT(1X,6(2X,F7.2))
  15    I=I+1
        IF(I.LE.NV) GO TO 5
        VCLS=VCLS-1.0
        IF(VCLS.NE.1.0) GO TO 1
C
C       NORMALIZATION OF ROTATIONAL ANGLE BY MEANS OF THE ORIENTATION
C       OF THE NEAREST SATELITE AT A GIVEN CORE
C
        I=1
 300    J=1
 301    IF(J.NE.1) GO TO 308
        IF(RR(I,J).NE.0.0) GO TO 305
        IF(BB(I,J).EQ.0.0) GO TO 304
        THETA(I)=BB(I,J)
        BB(I,J)=0.0
 302    J=J+1
        IF(J.LE.NR(I)) GO TO 301
 303    I=I+1
        IF(I.LE.NN) GO TO 300
        GO TO 309
```

```
304   THETA(I)=0.0
      GO TO 303
305   THETA(I)=AA(I,J)
306   AA(I,J)=AA(I,J)-THETA(I)
307   BB(I,J)=BB(I,J)-THETA(I)
      GO TO 302
308   IF(RR(I,J)) 307,307,306
309   CONTINUE
      RETURN
      END
      SUBROUTINE NGBR1(CX,CY,VX,VY,X1,Y1,X2,Y2,NV,NL,
     1 NBCNT,R,A,B,MR,MOD)
C     THIS ROUTINE DETERMINES FEATURE NEIGHBORS FOR
C     A GIVEN FEATURE CORE.
C
C
C     CX,CY......COORDINATES OF FEATURE CORE
C     VX,VY......COORDINATES OF VERTICES
C     NV.........TOTAL NUMBER OF VERTICES
C     NL.........TOTAL NUMBER OF LINE SEGMENTS
C     X1,Y1,X2,Y2..COORDINATES OF THE END POINTS
C                  OF LINE SEGMENTS
C     NBCNT......TOTAL NUMBER OF NEIGHBER COUNT
C     R,A,B......PARAMETERS OF RIV DEFINITION
C
C
      INTEGER*2 NV,NL
      DIMENSION VX(NV),VY(NV),X1(NL),Y1(NL),X2(NL),Y2(NL)
      DIMENSION R(250),A(250),B(250)
      NBCNT=0
      I=1
      IF(MOD.EQ.2) GO TO 5
1     IF(I.GT.NV) GO TO 18
      IF(VX(I).EQ.CX.AND.VY(I).EQ.CY) GO TO 55
      BX=VX(I)
      BY=VY(I)
      CALL NBTST1(CX,CY,BX,BY,MR,NBCNT,R,A)
      B(NBCNT)=0.0
55    I=I+1
      IF(I.LE.NV) GO TO 1
      GO TO 18
5     IF(I.GT.NL) GO TO 18
      BX=X1(I)
      BY=Y1(I)
      L=NBCNT
      CALL NBTST1(CX,CY,BX,BY,MR,NBCNT,R,A)
      IF(L.EQ.NBCNT) GO TO 17
      DX=X2(I)-BX
      DY=Y2(I)-BY
      IF(DX.EQ.0.0) GO TO 10
      P=ATAN2(DY,DX)
      B(NBCNT)=P/3.14159*180.0
      GO TO 17
10    IF(DY)15,16,16
15    B(NBCNT)=-90.
      GO TO 17
16    B(NBCNT)=90.
17    I=I+1
      IF(I.LE.NL) GO TO 5
18    RETURN
      END
      SUBROUTINE NBSORT(NBCNT,R,A,B,RR,AA,BB,NN,NV)
C
C     THIS ROUTINE SORTS NEIGHBERS IN ASCENDING ORDER
C     FOR THE ABSOLUTE VALUE OF R.
C
      DIMENSION R(250),A(250),B(250)
      DIMENSION RR(250,250),AA(250,250),BB(250,250)
      I=1
1     ICNT=0
      C=R(I)
      J=1
```

```
5       IF(R(J)-C) 10,11,12
10      ICNT=ICNT+1
        GO TO 12
11      IF(I.GE.J) GO TO 10
12      J=J+1
        IF(J.LE.NBCNT) GO TO 5
        II=ICNT
        RR(NN,II)=R(I)
        AA(NN,II)=A(I)
        BB(NN,II)=B(I)
        I=I+1
        IF(I.LE.NBCNT) GO TO 1
        RETURN
        END
        SUBROUTINE RIVCMP1(SX,SY,SC,RX,RY,RC,SR,SA,SB,STHA,RTHA
       1,RR,RA,RB,NRS,NRR,NSC,NRC,MSCOR,DLTX,DLTY,DLTHA,NDL,XO,YO)
C
C       THIS ROUTINE COMPARES A SENSED IMAGE FEATURE RIV
C       WITH THE REFERENCE IMAGE FEATURE RIV TO COUNT
C       THE MATCHING SCORES.
C
C       SX,SY...... COORDINATES OF SENSED FEATURE CORES
C       SC......... CLASS OF SENSED FEATURE CORES
C       RX,RY...... COORDINATES OF REFERENCE FEATURE CORES
C       RC......... CLASS OF REFERENCE FEATURE CORES
C       SR,SA,SB... PARAMETERS OF SENSED FEATURE RIV DEFINITION
C       RR,RA,RB... PARAMETERS OF REF. FEATURE RIV DEFINTION
C       NRS........ NO. OF NEIGHBORS ABOUT A GIVEN CORE
C                   IN THE SENSED FEATURE RIV
C       NRR........ NO. OF NEIGHBORS ABOUT A GIVEN CORE
C                   IN THE REFERENCE FEATURE RIV
C       NSC........ TOTAL NUMBER OF CORES IN THE SENSED
C                   FEATURE RIV
C       NRC........ TOTAL NUMBER OF CORES IN THE REFERENCE
C                   FEATURE RIV
C       MSCOR...... FEATURE MATCHING SCORE
C       STHA....... ORIENTATION ANGLE OF THE NEAREST LINE SEGMENT
C                   AT A GIVEN CORE IN SENSED FEATURE RIV
C       RTHA....... ORIENTATION ANGLE OF THE NEAREST LINE SEGMENT
C                   AT A GIVEN CORE IN REFERENCE FEATURE RIV
C
        DIMENSION SX(700),SY(700),SC(700),NRS(50),STHA(50)
        DIMENSION RX(700),RY(700),RC(700),NRR(50),RTHA(50)
        DIMENSION SR(50,50),SA(50,50),SB(50,50)
        DIMENSION RR(50,50),RA(50,50),RB(50,50)
        DIMENSION DLTX(700),DLTY(700),DLTHA(700),MSCOR(700),MSCOR1(700)
        DIMENSION SXD(700),RXD(700),SYD(700),RYD(700),SCOR(700)
        TYPE 100
100     FORMAT(1H0,1X,'ENTER THREE THRESHOLDS OF IRT,IPT, AND ITT')
        ACCEPT 101, IRT,IPT,ITT
101     FORMAT(3I2)
        NDL=0
        IS=1
1       IR=1
2       IF(SC(IS).NE.RC(IR)) GO TO 20
        NDL=NDL+1
        MCNT=0
        L=1
        M=1
        MSET=0
        SXD(NDL)=SX(IS)
        RXD(NDL)=RX(IR)
        SYD(NDL)=SY(IS)
        RYD(NDL)=RY(IR)
        DLTX(NDL)=RX(IR)-SX(IS)
        DLTY(NDL)=RY(IR)-SY(IS)
        DLTHA(NDL)=STHA(IS)-RTHA(IR)
5       DR=ABS(SR(IS,L)-RR(IR,M))
        IDR=IFIX(DR+0.5)
        IF(IDR.GT.IRT) GO TO 200
        DPHI=ABS(SA(IS,L)-RA(IR,M))
        IDPHI=IFIX(DPHI+0.5)
```

```
        IF(IDPHI.GT.IPT) GO TO 200
        DTH=ABS(SB(IS,L)-RB(IR,M))
        IDTH=IFIX(DTH+0.5)
        IF(IDTH.GT.ITT) GO TO 200
        MSET=1
        GO TO 10
200     M=M+1
        IF(M.LE.NRR(IR)) GO TO 5
        IF(MSET.NE.1) GO TO 12
        M=NRR(IR)
        GO TO 13
12      M=1
13      L=L+1
        IF(L.LE.NRS(IS)) GO TO 5
        GO TO 15
10      MCNT=MCNT+1
        L=L+1
        M=M+1
        IF(M.LE.NRR(IR).AND.L.LE.NRS(IS)) GO TO 5
15      MSCOR(NDL)=MCNT
20      IR=IR+1
        IF(IR.LE.NRC) GO TO 2
        IS=IS+1
        IF(IS.LE.NSC) GO TO 1
        WRITE(6,250) NDL
250     FORMAT(1H0,1X,I4)
        DO 50 I=1,NDL
        WRITE(6,260) DLTX(I),DLTY(I),SXD(I),SYD(I)
       1,RXD(I),RYD(I),DLTHA(I),MSCOR(I)
260     FORMAT(1H,1X,6(F7.2,1X),1X,F7.2,3X,I4)
50      CONTINUE
C       ..........................................
C       SORT MSCOR(I) IN ASCENDING ORDER AND DEFINE
C       THE THRESHOLDS OF MATCHING SCORE
C       ..........................................
        DO 270 I=1,NDL
270     MSCOR1(I)=MSCOR(I)
        DO 280 J=NDL,1,-1
        DO 280 I=1,J
        IF(MSCOR1(I).LE.MSCOR1(J)) GO TO 280
        TEMP=MSCOR1(I)
        MSCOR1(I)=MSCOR1(J)
        MSCOR1(J)=TEMP
280     CONTINUE
        WRITE(6,290) (MSCOR1(I),I=1,NDL)
290     FORMAT(1H0,20(1X,I2))
        IDCNT=0
        DO 291 I=1,NDL
        IF(MSCOR1(I).EQ.0) GO TO 291
        IDCNT=IDCNT+1
        MSCOR1(IDCNT)=MSCOR1(I)
291     CONTINUE
        IF(IDCNT.EQ.0) GO TO 460
        ISUM=0
        VSUM=0.0
        DO 350 I=1,IDCNT
        ISUM=ISUM+MSCOR1(I)
350     CONTINUE
        AMEAN=FLOAT(ISUM)/FLOAT(IDCNT)
        IF(IDCNT.EQ.1) GO TO 354
        DO 351 I=1,IDCNT
        VAR=FLOAT(MSCOR1(I))-AMEAN
        VSUM=VSUM+VAR*VAR
351     CONTINUE
        VSUM=VSUM/FLOAT(IDCNT-1)
        VAR=SQRT(VSUM)
        GO TO 355
354     VAR=0.0
355     MSTH=IFIX(AMEAN+VAR+0.5)
        IF(IDCNT.NE.2) GO TO 352
        ISDIF=MSCOR1(IDCNT)-MSCOR1(IDCNT-1)
```

```
          IF(ISDIF.GT.1) MSTH=MSTH-1
352       IF(VAR.EQ.0.0) MSTH=MSTH-1
          WRITE(6,360) AMEAN,VAR,MSTH
360       FORMAT(1H0,1X,'MEAN=',F5.2,2X,'SD=',F5.2,2X,'MSTH=',I2)
          IF(MSTH.LT.2.AND.IDCNT.GT.1) GO TO 460
          DO 380 I=1,NDL
          IF(MSCOR(I).GE.MSTH) GO TO 380
          MSCOR(I)=0
380       CONTINUE
C
C         3-D CENTROID CALCULATION FOR THE TRANSLATIONAL
C         COORDINATES AND ROTATIONAL ANGLE BY MEANS OF
C         THE MATCH SCORES
C
          SUM=0.0
          XSUM=0.0
          YSUM=0.0
          PSUM=0.0
          DO 400 I=1,NDL
          IF(MSCOR(I).EQ.0) GO TO 400
          SCOR(I)=FLOAT(MSCOR(I))
          DLTX(I)=DLTX(I)+16.0
          DLTY(I)=DLTY(I)+16.0
          DLTHA(I)=DLTHA(I)+360.0
          SUM=SUM+SCOR(I)
          XSUM=XSUM+DLTX(I)*SCOR(I)
          YSUM=YSUM+DLTY(I)*SCOR(I)
          PSUM=PSUM+DLTHA(I)*SCOR(I)
400       CONTINUE
          IF(SUM.EQ.0.0) GO TO 460
          CP=PSUM/SUM-360.0
          ICP=IFIX(CP+0.5)
          IF(ICP.EQ.0) GO TO 430
          CPR=-CP/180.*3.14159
          COSA=COS(CPR)
          SINA=SIN(CPR)
          NDL1=0
          DO 410 I=1,NDL
          IF(MSCOR(I).EQ.0) GO TO 410
          NDL1=NDL1+1
          RLX=SXD(I)-XO
          RLY=SYD(I)-YO
          SXD(I)=RLX*COSA-RLY*SINA+XO
          SYD(I)=RLX*SINA+RLY*COSA+YO
          DLTX(NDL1)=RXD(I)-SXD(I)
          DLTY(NDL1)=RYD(I)-SYD(I)
          MSCOR(NDL1)=MSCOR(I)
410       CONTINUE
          WRITE(6,411)(DLTX(I),DLTY(I),MSCOR(I),I=1,NDL1)
411       FORMAT(1H ,1X,2(F7.2,2X),1X,I3)
          SUM=0.0
          XSUM=0.0
          YSUM=0.0
          DO 420 I=1,NDL1
          SCOR(I)=FLOAT(MSCOR(I))
          DLTX(I)=DLTX(I)+16.0
          DLTY(I)=DLTY(I)+16.0
          SUM=SUM+SCOR(I)
          XSUM=XSUM+DLTX(I)*SCOR(I)
          YSUM=YSUM+DLTY(I)*SCOR(I)
420       CONTINUE
          IF(SUM.EQ.0.0) GO TO 460
430       CX=XSUM/SUM
          CY=YSUM/SUM
          ICX=IFIX(CX+XO+0.5)-16
          ICY=IFIX(CY+YO+0.5)-16
          WRITE(6,450) ICX,ICY,CP
450       FORMAT(1X,'THE CENTROID FOR MATCH X,Y,THETA=' 2(I4,2X),1X,F7.2)
          GO TO 500
460       TYPE *,'NO MATCH'
500       RETURN
          END
```

1. A nonvolatile integrated circuit package, comprising:
   a housing;
   an integrated circuit retained in said housing;
   a plurality of conductors supported by said housing for providing external data communication with said integrated circuit;
   a battery removably retained in said housing;
   at least one power conductor supported by said housing for supplying power from an external power source;
   a switchover circuit positioned within said housing and electrically connected to said integrated circuit, said battery and said power conductor for causing power to be supplied to said integrated circuit from said battery when power is not being supplied to said integrated circuit from the external power source; and
   resilient contacts secured in said housing in contact with said battery for electrically connecting said battery to said switchover circuit.

2. A nonvolatile integrated circuit package as recited in claim 1, wherein said power conductor and said plurality of conductors each have first ends defining electrical contacts for making external power and external data connections, respectively.

3. A nonvolatile integrated circuit package as recited in claim 2, wherein said electrical contacts include pins.

4. A nonvolatile integrated circuit package as recited in claim 2, wherein said electrical contacts include tabs.

5. A nonvolatile integrated circuit package as recited in claim 1, wherein said power conductor and said plurality of conductors comprise a lead frame.

6. A nonvolatile integrated circuit package as recited in claim 8, wherein said resilient contacts are spring biased against said battery and assist in retaining said battery in said housing.

7. A nonvolatile integrated circuit package as recited in claim 1, wherein said resilient contacts are spring biased against said battery in opposing directions.

8. A nonvolatile integrated circuit package as recited in claim 1, wherein said integrated circuit is formed on a semiconductor chip, and wherein said chip is encapsulated within said housing.

9. A nonvolatile integrated circuit package as recited in claim 1, wherein said switchover circuit comprises a diode.

10. A nonvolatile integrated circuit package as recited in claim 1, wherein said housing comprises walls defining a first recess for retaining said battery and a second recess for retaining a second battery, and a second resilient contacts secured in said housing in contact with said second battery.

11. A nonvolatile integrated circuit package as recited in claim 10, wherein said first and second batteries are generally disk shaped, and wherein the first and second recesses defined by said walls are generally cylindrical to conform to the shape of said batteries.

12. A nonvolatile integrated circuit package as recited in claim 1, wherein said power conductor and said plurality of conductors comprise a printed circuit board.

13. A nonvolatile integrated circuit package as recited in claim 2, wherein said electrical contacts include sockets.

* * * * *

UNITED STATES PATENT AND TRADEMARK OFFICE
CERTIFICATE OF CORRECTION

PATENT NO. : 5,276,354

DATED : January 4, 1994

INVENTOR(S) : Joseph Link, Michael L. Bolan, Allen H. Brunk, Jr., Paul E. Schneikart It is certified that error appears in the above-identified patent and that said Letters Patent is hereby corrected as shown below:

Appendix A appearing in columns 5-104 are deleted.

Signed and Sealed this

Fourth Day of October, 1994

Attest:

BRUCE LEHMAN

Attesting Officer

Commissioner of Patents and Trademarks